US005892424A

United States Patent [19]

Yamamoto et al.

[11] Patent Number: 5,892,424

[45] Date of Patent: Apr. 6, 1999

[54] ENCAPSULATED CONTACT MATERIAL AND A MANUFACTURING METHOD THEREFOR, AND A MANUFACTURING METHOD AND A USING METHOD FOR AN ENCAPSULATED CONTACT

[75] Inventors: Kiyoshi Yamamoto, Nikko; Masanori Ozaki, Utsunomiya; Takeshi Hirasawa, Nikko; Yoshikazu Ohashi, Imaichi, all of Japan

[73] Assignee: The Furukawa Electric Co., Ltd., Tokyo, Japan

[21] Appl. No.: 596,945

[22] Filed: Feb. 5, 1996

[30] Foreign Application Priority Data

Feb. 10, 1995 [JP] Japan .................................... 7-023167
Mar. 1, 1995 [JP] Japan .................................... 7-042171

[51] Int. Cl.$^{6}$ ........................................................ H01L 1/66

[52] U.S. Cl. ............................. 335/151; 335/58; 427/165

[58] Field of Search ..................................... 335/151–154, 335/58–60; 318/594, 146, 158; 218/22; 427/165

[56] References Cited

U.S. PATENT DOCUMENTS

| | | | |
|---|---|---|---|
| 3,873,902 | 3/1975 | Burch | 318/594 |
| 4,348,566 | 9/1982 | Baba et al. | 200/262 |
| 5,594,400 | 1/1997 | King | 335/154 |

FOREIGN PATENT DOCUMENTS

| | | |
|---|---|---|
| 0 612 085 | 8/1994 | European Pat. Off. . |
| 59-117022 | 7/1984 | Japan . |
| 427719 | 4/1935 | United Kingdom . |
| 1 214 697 | 12/1970 | United Kingdom . |
| 1 339 965 | 12/1973 | United Kingdom . |
| 1 449 083 | 9/1976 | United Kingdom . |

*Primary Examiner*—Lincoln Donovan
*Attorney, Agent, or Firm*—Frishauf, Holtz, Goodman, Langer & Chick, P.C.

[57] ABSTRACT

In an encapsulated contact material which varies little in contact resistance and has good working life performance, at least one contact coating layer is formed covering the surface of a contact substrate. The contact coating layer includes a substantial matrix formed of at least one element selected from a group including Mo, Zr, Nb, Hf, Ta, and W, the matrix being loaded with 0.5 to 50 atom % of at least one element selected from a group including Zn, Cd, Hg, Al, Ga, In, Tl, Ge, Sn, Pb, As, Sb, and Bi. The contact coating layer has a thickness of 0.1 $\mu$m or more.

20 Claims, 4 Drawing Sheets

ENCAPSULATED CONTACT MATERIAL AND A MANUFACTURING METHOD THEREFOR, AND A MANUFACTURING METHOD AND A USING METHOD FOR AN ENCAPSULATED CONTACT

BACKGROUND OF THE INVENTION

1. Field of the Invention

The present invention relates to an encapsulated contact material and a manufacturing method therefor, and a manufacturing method and a using method for an encapsulated contact, and more specifically, to an encapsulated contact material subject to less variations in contact resistance during switching operation, enjoying satisfactory working life performance, and capable of low-cost production.

2. Prior Art

An encapsulated contact which is used for a reed switch or the like is constructed so that an encapsulated contact material, along with an $N_2$ gas, for example, is encapsulated in a sealed container which is formed of glass or the like.

In popular conventional encapsulated contact materials, a contact substrate is formed of, e.g., Fe—Ni alloy, and its surface is coated with Rh or Ru, which serves as a contact coating layer. Rh, Ru, etc. are frequently used because they are high-hardness, high-melting metals which have good electrical conductivity and wear resistance.

These conventional encapsulated contact materials are manufactured in a manner such that an intermediate layer is first formed on the surface of the contact substrate by, for example, electroplating the substrate surface with a metal, such as Ag, Au or Cu, and a contact coating layer is then formed on the intermediate layer by plating it with Rh or Ru. The intermediate layer is intended for improved adhesion between the contact substrate and the contact coating layer and prevention of diffusion of Rh or Ru of the contact coating layer into the contact substrate during contact switching operation.

Using Rh or Ru which is an expensive metal, however, the above encapsulated contact materials entail high material cost, thus involving a problem of economic efficiency.

Recently, therefore, there have been proposed low-cost encapsulated contact materials which, like the conventional ones, use Fe-Ni alloy or the like for the contact substrate, and employ a high-melting metal, such as Mo, W, or its alloy, for the contact coating layer.

The contact coating layers of aforesaid encapsulated contact materials have advantageous characteristics such as a high melting point, high hardness, and high electrical conductivity, among other essential characteristics for the contact coating layer. However, the materials of this type have been found to behave in the following manner.

In the case of a material whose contact coating layer is formed of W, for example, a contact working test based on repeated switching operation at 10 Hz may reveal substantial variations in contact resistance or frequent generation of intensive arc discharge in the contact coating layer. If the encapsulated contact material is subject to increased variations in contact resistance, the contact resistance of the encapsulated contact during the switching operation is liable to fluctuate, and besides, heat release from the the encapsulated contact increases. As a result, the working life of the encapsulated contact is shortened and varies substantially, so that the reliability of the contact in actual use is lowered.

These problems are believed to arise because the contact coating layer which is formed of Mo, W, or its alloy does not enjoy satisfactory wear resistance, and lowers the arc characteristics of the contact. Another cause lies in that Mo, W, and their alloys are all susceptible to oxidation in the open air, so that an electrically insulating oxide film is easily formed on the surface of the metal.

In some cases, the oxide film will have already been formed on the surface of the contact coating layer (Mo or W) of the aforesaid contact material by the time the material is handled in the open air before it is encapsulated in the sealed container. Moreover, when the seal area surface of a contact substrate end portion is oxidized before the encapsulation, the contact coating layer may possibly be oxidized simultaneously to form an oxide film on the surface corresponding to the aforesaid contact substrate end portion.

Microscopically, the oxide film has a structure such that oxide particles are distributed in the surface of the contact coating layer. When the encapsulated contact, having the encapsulated contact material sealed therein with its surface in this state, is subjected to a repeated switching operation, the oxide particles migrate or move, and concentrate in the area where they are microscopically in actual contact with one another. Thus, the material which has the oxide film formed on its contact coating layer is supposed to be worsened in the aforementioned working life characteristics.

Normally, the encapsulated contact undergoes the switching operation with a voltage (current) applied thereto.

In general, however, snapping may possibly be caused on the load side during use of electrical equipment. In such a case, the switching operation of the encapsulated contact advances without the application of any voltage (current). Even if snapping is caused by the exhaustion of a light emitting diode or the like which is connected to the encapsulated contact, for example, the contact is subjected to repeated no-load switching operation.

In the case of a reed switch, in particular, its switching magnet operates even in a no-load state, so that there is a high possibility of its encapsulated contact being forced to undergo the no-load switching operation.

In the case of an encapsulated contact having the encapsulated contact material therein whose contact coating layer is formed of Mo, W, or its alloy, the repeated no-load switching operation causes the contact resistance to increase, thereby lowering the stability and reliability of the resulting switch. The aforementioned problems are liable to arise especially in the case where an oxide film is formed on the surface of the contact coating layer of the encapsulated contact material.

In order to solve the above-described problems of the encapsulated contact material whose contact coating layer is formed of Mo, W, or its alloy, the inventors hereof developed and filed an application (Jpn. Pat. Appln. Publication No. 4-19885) for an encapsulated contact material in which a contact coating layer is formed by coating the surface of a contact substrate with a material consisting mainly of Mo, W, Re, Nb, or Ta, and an oxidation-retardant, electrically conductive thin layer of Ru, Rh, Pd, Os, Ir, Pt, Ag, or Au is formed on the coating layer.

In the case of this encapsulated contact material, the oxidation-retardant, conductive thin layer on the surface of the contact coating layer lessens the possibility of the formation of an oxide film which may otherwise be caused when the material is encapsulated in the sealed container. Thus, the encapsulated contact material of this kind is subject to less variations in its initial contact resistance.

Despite the limited variations in the initial contact resistance, however, the encapsulated contact material described above cannot always enjoy good weld resistance and satisfactory arc resistance, in consideration of the requirement for a prolonged working life after initial operation. Accordingly, those characteristics of the contact material are expected to be improved further. To cope with this requirement, the inventors hereof developed and filed an application (Jpn. Pat. Appln. Publication No. 6-39114) for an encapsulated contact material in which a contact coating layer is formed by coating the surface of a contact substrate with a material composed of a matrix which is formed of at least one high-melting metal selected from a group including Mo, Zr, Nb, Hf, Ta, and W, and is loaded with at least one element selected from a group including Li, K, Ce, Cs, Ba, Sr, Ca, Na, Y, La, Sc, Th, and Rb or an oxide thereof, and an encapsulated contact material in which the contact coating layer is loaded with trace amounts of elements, such as Mg, Pb, Sn, Zn, Bi, Ag, Cd, Al, Si, Zr, Ti, Co, Ta, Fe, Mn, Cr, etc.

In the cases of these encapsulated contact materials, the elements, including Li, K, Ce, Cs, Ba, Sr, Ca, Na, Y, La, Sc, Th, Rb, etc., which are contained in the matrix of the contact coating layer have small work functions. In the contact coating layer loaded with these elements, generation of an arc during the switching operation of the encapsulated contact is macroscopically uniform, so that exposure of the contact substrate at the lower part of the coating layer is retarded. Thus, the working life of the material is lengthened.

Microscopically, however, the arc causes infinitesimal indentations to be formed all over the surface of the contact coating layer, and these indentations may change the area of contact between contact coating layers or bite each other, thereby bringing about switching failure (locking). Thus, the working life of the material may possibly be shortened.

In the case of the contact coating layer which further contains the trace elements, including Mg, Pb, Sn, Zn, Bi, Ag, Cd, Al, Si, Zr, Ti, Co, Ta, Fe, Mn, Cr, etc., the trace elements are alloyed with the additive elements, such as Li, K, Ce, Cs, Ba, Sr, Ca, Na, Y, La, Sc, Th, Rb, etc., thereby restraining evaporation of the additive elements and the like. Although this behavior ensures the effect to reduce variations in contact resistance during the switching operation of the encapsulated contact, the working life performance cannot be expected to be much better than that of the material which contains none of the trace elements. In the case of an encapsulated contact which incorporates the encapsulated contact material having its contact coating layer loaded with the trace elements, moreover, there is a problem that variations in working life performance of the encapsulated contacts produced in various production lots are substantial, that is, the stability in product quality is poor.

OBJECTS AND SUMMARY OF THE INVENTION

An object of the present invention is to provide an encapsulated contact material which enjoys better working life performance , and is subject to less variations in contact resistance than the encapsulated contact material described in Jpn. Pat. Appln. Publication No. 6-39114.

Another object of the invention is to provide an encapsulated contact material which is subject to less variations in characteristics between production lots, and therefore, enjoys stable working life performance.

Still another object of the invention is to provide an encapsulated contact material which uses Rh, Ru or other expensive material at a minimum, thereby ensuring low-cost production.

A further object of the invention is to provide a manufacturing method for an encapsulated contact material, by which the composition, surface configuration, and structure of a contact coating layer are stabilized so that the working life performance of the material is steady.

An additional object of the invention is to provide a manufacturing method and a method of using an encapsulated contact, in which the contact resistance cannot be worsened even though an oxide film is formed, for example, on the surface of a contact coating layer of an encapsulated contact material or if no-load switching operation is repeated.

In order to achieve the above objects, according to the present invention, there is provided an encapsulated contact material (hereinafter referred to as contact material A) which comprises at least one contact coating layer formed covering the surface of a contact substrate, the contact coating layer including a substantial matrix formed of at least one element selected from a group including Mo, Zr, Nb, Hf, Ta and W, the matrix being loaded with 0.5 to 50 atom % of at least one element selected from a group including Zn, Cd, Hg, Al, Ga, In, Tl, Ge, Sn, Pb, As, Sb, and Bi, and the contact coating layer having a thickness of 0.1 $\mu$m or more.

According to the invention, moreover, there is provided an encapsulated contact material (hereinafter referred to as contact material B) which comprises at least one contact coating layer formed covering the surface of a contact substrate, the contact coating layer including a substantial matrix formed of at least one element selected from a group including Mo, Zr, Nb, Hf, Ta, and W, the matrix being loaded with 0.1 to 50 mole % of an oxide of at least one element selected from a group including Zn, Cd, Hg, Al, Ga, In, Tl, Ge, Sn, Pb, As, Sb, and Bi, and the contact coating layer having a thickness of 0.1 $\mu$m or more.

According to the invention, furthermore, there is provided an encapsulated contact material (hereinafter referred to as contact material C) which comprises at least one contact coating layer formed covering the surface of a contact substrate, the contact coating layer having at least one laminated structure comprising including at least one lower layer formed of at least one element selected from a group including Mo, Zr, Nb, Hf, Ta, and W and at least one upper layer formed of at least one element selected from a group including Zn, Cd, Hg, Al, Ga, In, Tl, Ge, Sn, Pb, As, Sb, and Bi, and the lower and upper layers having a thickness of 0.1 $\mu$g or more each.

According to the invention, moreover, there is provided a manufacturing method for an encapsulated contact material, which comprises forming the contact coating layer of the contact material A or B on the surface of the contact substrate with the temperature of the contact substrate controlled within the range of 300° to 900° C.

According to the invention, furthermore, there is provided a manufacturing method for an encapsulated contact material, which comprises forming the contact coating layer of the contact material C on the surface of the contact substrate in a manner such that the temperature of the contact substrate is controlled within the range of 300° to 600° C. when the lower layer is formed and within the range of 50° to 500° C. when the upper layer is formed.

According to the invention, there is provided a manufacturing method for an encapsulated contact, which comprises encapsulating an encapsulated contact material together with an inert gas in a sealed container, and electrically discharging the encapsulated contact material.

According to the invention, moreover, there is provided a method of using an encapsulated contact, which comprises electrically discharging an encapsulated contact material before or during use of an encapsulated contact formed of an encapsulated contact material encapsulated together with an inert gas in a sealed container.

DETAILED DESCRIPTION OF THE INVENTIONS

A contact material A will be described first.

Figure 1:
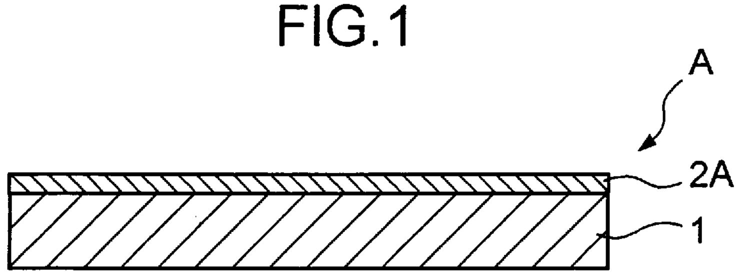
FIG. 1 is a sectional view of a contact material A according to the present invention.

In the contact material A, as shown in FIG. 1, a contact coating layer 2A (mentioned later) is formed by coating the surface of a contact substrate 1.

The material of the contact substrate 1 is not subject to any special restrictions, and may be any substance which is conventionally used as a substrate material for encapsulated contacts. For example, Fe, Ni, Co, Ni—Fe, Co—Fe—Nb, Co—Fe—V, Fe—Ni—Ni—Al—Ti, Fe—Co—Ni, carbon steel, phosphor bronze, nickel silver, brass, stainless steel, Cu—Ni—Sn, Cu—Ti, etc. may be used for this purpose in consideration of the reduction of manufacturing cost.

The contact coating layer 2A is composed of an alloy matrix (hereinafter referred to as matrix metal) and an additive element or elements. The matrix metal may be formed of at least one metal, e.g., a simple metal, selected from a group including Mo, Zr, Nb, Hf, Ta, and W, or an alloy, such as Hf—Nb, Hf—Ta, Hf—Mo, Hf—Zr, Hf—W, Mo—Nb, Mo—Ta, Mo—Zr, M—W, Nb—Ta, Nb—W, Nb—Zr, Ta—W, Ta—Zr, or W—Zr. The additive element(s) may be at least one element selected from a group including Zn, Cd, Hg, Al, Ga, In, Tl, Ge, Sn, Pb, As, Sb, and Bi.

Since all the aforesaid matrix metals which may constitute the matrix of of the contact coating layer 2A have a high melting point and high hardness, they serve to enhance the wear resistance of the contact coating layer.

The additive elements contained in the matrix stabilize the contact resistance of the contact coating layer during switching operation, and make for the improvement of the wear resistance and oxidation resistance. This is believed, though not definitely, to be based on the following reasons.

The aforesaid additive elements have lower melting and boiling points than those of the matrix metal. Therefore, the additive elements are supposed to be caused to migrate freely from the matrix toward the surface of the contact coating layer 2A and "ooze out" to the surface by electric power load which is generated during the switching operation of the encapsulated contact, for example, thereby conducing to the stabilization of the contact resistance and the arc characteristics.

If oxygen in the atmosphere is captured into the contact coating layer through its surface during the formation of the coating layer or the manufacture of the encapsulated contact, the captured oxygen is supposed, for example, to be adsorbed by the additive elements. Thus, it is believed that the oxygen is seized by the additive elements, so that the matrix metal of the contact coating layer is restrained from being oxidized, and an insulating oxide film cannot be easily formed on the surface of the layer.

In contrast with the case where an oxide film is formed on the surface of the contact coating layer, therefore, the contact resistance is not likely to become unstable with ease, and stabilization of the arc characteristics lowers the possibility of the locking effect, so that the working life performance is improved.

Preferably, in consideration of these circumstances, the additive elements are dispersed as simple substances in the matrix metal without producing intermetallic compounds during the formation of the contact coating layer 2A (mentioned later), in order to fulfill their functions.

Preferred combinations of the matrix metal and the additive elements which constitute the aforesaid preferable contact coating layer 2A include, for example, Mo—Bi, Mo—Cd, Mo—Hg, Mo—In, Mo—Pb; Nb—Bi, Nb—Hg, Nb—Pb; Ta—Bi, Ta—Hg; W—Bi, W—Cd, W—Ga, W—Hg, W—In, W—Pb, W—Sb, W—Sn, W—Zn, etc.

The content of additive elements in the contact coating layer 2A is adjusted to 0.5 to 50 atom %.

If the content is lower than 0.5 atom %, the additive elements cannot satisfactorily produce the aforementioned effects, and the contact resistance during the switching operation tends to become unstable. If the content is higher than 50 atom %, on the other hand, the electrical resistance of the contact coating layer 2A becomes so high that the electrical conductivity is lowered. Preferably, the content ranges from 5 to 30 atom %, further preferably from 10 to 20 atom %.

The thickness of the contact coating layer 2A is adjusted to 0.1 $\mu$m or more.

If the layer 2A is thinner than 0.1 $\mu$m, it lacks in wear resistance and cannot enjoy a satisfactory working life performance for the encapsulated contact. The upper limit of the thickness of the contact coating layer 2A is suitably settled in consideration of the working conditions and manufacturing cost of the encapsulated contact to be manufactured. If the contact coating layer 2A is made too thick when it is formed by the film forming method mentioned later, for example, its surface easily roughens, so that the contact resistance is liable to increase, and the film formation entails higher cost. Preferably, therefore, the upper limit of the thickness of the layer 2A is adjusted to 100 $\mu$m.

In this contact coating layer 2A, the additive elements may be distributed in the matrix metal uniformly or with a concentration gradient in the thickness direction.

In the case where the additive elements are distributed with the concentration gradient in the thickness direction, the concentration of the additive elements is made higher on the surface side of the contact coating layer 2A. In other words, the additive elements are distributed so that the matrix metal concentration is higher on the contact substrate side.

If this concentration gradient is formed in the contact coating layer, the high-melting, high-hardness matrix metal exists more in the portion toward the contact substrate 1, so that the strength properties of the encapsulated contact material are improved to facilitate the maintenance of the structure of the contact coating layer. As mentioned before, the concentration of the additive elements which produce the aforesaid effects is higher on the surface side. Even if the contact coating layer 2A comes into contact with oxygen and captures it, for example, therefore, the oxygen can be immediately seized to restrain oxidation of the matrix metal and in advance of the oxidative reaction in the inner part of the layer. Thus, an oxide film cannot be easily formed on the surface of the contact coating layer, and the contact resistance during the switching operation can be stabilized more satisfactorily.

The concentration gradient may be a linear one. In the case where the film forming method (mentioned later) is used, however, a staged concentration gradient makes the formation easier. For example, it is necessary only that the matrix metal content be 50 to 100 atom % (0 to 49 atom % for the additive elements) at the coating layer portion on the contact substrate side and 0 to 49 atom % (51 to 100 atom % for the additive elements) at the surface portion.

Even in the case where the aforesaid concentration gradient of the additive elements is formed in the contact coating layer 2A, the content of the additive elements must be set at the aforementioned value, 0.5 to 50 atom %, as an average value.

If the contact coating layer 2A having the aforesaid composition is further loaded with 1 to 40 atom % of oxygen, equalization or uniformalization of the generated arc can be accelerated by an unknown mechanism during the switching operation of the encapsulated contact. If the oxygen content is lower than 1 atom %, in this case, the aforesaid effects are lessened. If the oxygen content is higher than 40 atom %, on the other hand, the electrical resistance of the contact coating layer 2A becomes so high that the electrical conductivity is lowered inevitably.

The contact coating layer 2A may be a single layer or a laminated structure composed of a plurality of layers.

According to the currently available film forming methods, the formed layer is inevitably subject to pinholes. However, thinner the layer is formed, generated pinholes are reduced. So, these pinholes can be reduced in number to improve the contact characteristics by forming the contact coating layer 2A by lamination or by stacking a plurality of laminar layers.

The laminar layers of the laminated contact coating layer may be formed of the same or different materials. In the latter case, the individual laminar layers can complementally fulfill their respective functions.

In the encapsulated contact material A, an intermediate layer may be interposed between the contact substrate 1 and the contact coating layer 2A in order to enhance the adhesion between the two. The intermediate material may be formed of Ag, Al, or Au or an alloy based on these metals. These materials are advantageous in electrical conductivity and softness.

It is advisable, moreover, to form an outermost layer by coating the surface of the contact coating layer 2A of the encapsulated contact material A with a material which consists mainly of an electrically conductive metal or/and oxide. In this case, variations in initial contact resistance of the resulting encapsulated contact can be reduced.

The metal(s) used here may be one metal, such as Ru, Rh, Re, Pd, Os, Ir, Pt, Ag, or Au, or one or more metals selected from a group including Ag—Au, Ag—Pd, Ag—Pt, Ag—Rh, Au—Pd, Au—Pt, Au—Rh, Ir—Os, Ir—Pt, Ir—Ru, Os—Pd, Os—Ru, Pd—Pt, Pd—Rh, Rd—Ru, Pt—Rh, Re—Rh, Re—Ru, etc., for example. The oxide(s) may be one or more oxides selected from a group including $RuO_2$, $Rh_2O_3$, $RhO_2$, $ReO_3$, $OsO_4$, $IrO_2$, $Ir_2O_3$, etc., for example.

Preferably, the thickness of the outermost layer is adjusted to 0.05 μm or more. If the outermost layer is thinner than 0.05 μm, the aforementioned effects cannot be produced satisfactorily. Although the upper limit of the thickness is not subject to any special restrictions, it should only be suitably set in accordance the size of or intervals between encapsulated contact materials encapsulated in sealed containers and the cost of film formation. In general, the upper limit is set at 20 μm.

The following is a description of a contact material B according to the present invention.

Figure 2:
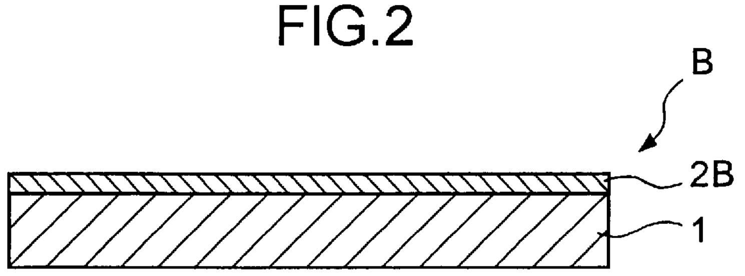
FIG. 2 is a sectional view of a contact material B according to the present invention.

This contact material B, as shown in FIG. 2, differs from the above-described contact material A only in that a contact coating layer 2B is composed of the matrix metal and an oxide of at least one element selected from a group including Zn, Cd, Hg, Al, Ga, In, Tl, Ge, Sn, Pb, As, Sb, and Bi.

In this case, as in the case where the aforesaid elements are dispersed as simple substances in the matrix metal, the contact resistance during the switching operation is stabilized, the wear resistance and oxidation resistance of the contact coating layer 2B are improved, and production of the locking effect is restrained, whereby the working life performance is improved.

The content of the aforesaid oxides in the contact coating layer 2B of the contact material B is set at 0.1 to 50 mole %. If the content is lower than 1 mole %, the contact resistance becomes unstable, so that the aforesaid effects cannot be produced with ease. If the content is higher than 50 mole %, the electrical resistance of the contact coating layer 2B becomes so high that the electrical conductivity is lowered.

The thickness of the contact coating layer 2B must be set at 0.1 μm or more for the same reason for the case of the contact material A. Preferably, the upper limit of this thickness is adjusted to 100 μm for the same reason.

If the contact coating layer 2B is further loaded with 1 to 40 atom % of oxygen, as in the case of the contact material A, equalization or uniformalization of the generated arc can be accelerated during the switching operation of the contact, so that the working life performance is improved. Preferably, in this case, the oxygen content is set within the aforesaid range for the same reason for the case of the contact material A.

For the same reason for the case of the contact material A, moreover, the contact coating layer 2B may be a laminated structure composed of a plurality of layers.

As in the case of the contact material A, an intermediate layer of the same material with the same thickness as aforesaid may be interposed between the contact coating layer 2B and the contact substrate 1, and an outermost layer of the same material with the same thickness as aforesaid may be formed by coating the coating layer 2B.

The following is a description of a contact material C according to the present invention.

Figure 3:
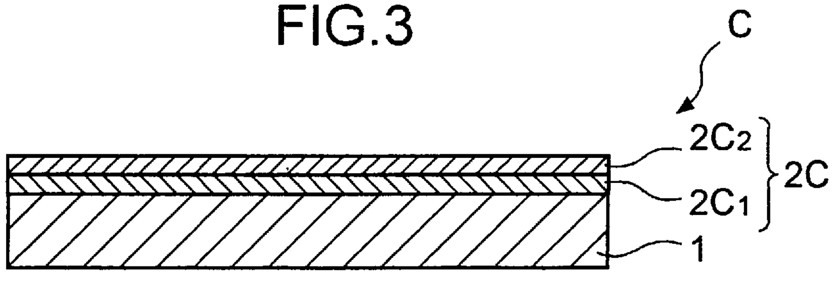
FIG. 3 is a sectional view of a contact material C according to the present invention.

In the case of this contact material C, as shown in FIG. 3, a contact coating layer 2C which is formed by coating the surface of the contact substrate 1 is a laminated structure, as a whole, which is composed of a lower layer 2C$_1$ and an upper layer 2C$_2$ thereon. The lower layer 2C$_1$ is formed of at least one metal selected from a group including Mo, Zr, Nb, Hf, Ta, and W. The upper layer $2C_2$ is formed of at least one metal selected from a group including Zn, Cd, Hg, Al, Ga, In, Tl, Ge, Sn, Pb, As, Sb, and Bi.

The contact coating layer 2C may be a single layer which is based on the laminated structure as a basic unit, composed of the lower and upper layers $2C_1$ and $2C_2$, or a laminated structure which is obtained by superposing an integral number of basic units.

In the case of the contact coating layer 2C, the surface of the lower layer $2C_1$, which is formed of a metal susceptible to oxidation, is covered by the upper layer $2C_2$ which is formed of an element capable of seizing oxygen, as mentioned before. If the coating layer 2C is brought into contact with oxygen while the encapsulated contact is being handled in the open air or manufactured, therefore, the oxygen is seized by the upper layer $2C_2$, so that oxidation of the lower layer $2C_1$ can be restrained. Accordingly, formation of an oxide film, which induces variations in the contact resistance during the switching operation, can be suppressed. Thus, the working life performance is better than in the case of the contact material A.

Although the lower and upper layers $2C_1$ and $2C_2$ may have a single-layer structure each, they may alternatively have a laminated structure including a plurality of laminar layers which are subject to less pinholes. In this case, the laminar layers of the lower and upper layers $2C_1$ and $2C_2$ may be formed of the same or different materials. In the latter case, the individual laminar layers can complementally fulfill their respective functions.

The respective thicknesses of the lower and upper layers $2C_1$ and $2C_2$ are both set at 0.1 $\mu$m or more. This is based on the same reason for the cases of the contact coating layers 2A and 2B of the contact materials A and B.

As in the cases of the contact materials A and B, a similar intermediate layer may be interposed between the contact substrate 1 and the lower layer $2C_1$, and moreover, a similar outermost layer may be formed on the surface of the upper layer $2C_2$.

Thus, according to the encapsulated contact materials A, B and C of the present invention, oxidation of the surface of the contact coating layer is restrained by the agency of the aforesaid additive elements and their oxides, so that the contact resistance and its variations are reduced, and the working life performance of the encapsulated contact is improved.

Further, the encapsulated contact can utilize W, Zr, Nb, Ta, Mo, etc. which conventionally have not been effectively used, and can reduce the usages of expensive Rh, Ru, etc. Thus, the encapsulated contact material obtained can be low-priced.

The following is a description of a method for manufacturing the contact materials A, B and C. These contact materials A, B and C can be manufactured by forming the contact coating layers 2A, 2B and 2C, respectively, on the surface of the contact substrate by a conventional film forming method.

First, the surface of the contact substrate is cleaned with rare gas ions, such as Ar, Ne, Kr, etc., by means of an ion bombard or electron shower, and a predetermined contact coating layer is then formed on the cleaned contact substrate surface by a conventional physical or chemical vapor deposition method, such as sputtering, ion-assisted vapor deposition, ion plating, or plasma CVD.

In forming the contact coating layer, it is essential suitably to control the temperature of the contact substrate, more specifically, the surface temperature of the substrate.

In general, if the surface temperature of the contact substrate is too low, crystallization of the contact coating layer formed on the substrate may be unsatisfactory, or the coating layer may become a porous pillar-shaped structure. Thus, the corrosion resistance of the coating layer is lowered, and ingredients may be diffused. If the surface temperature is too high, on the other hand, the resulting contact coating layer becomes a coarse pillar-shaped structure, and its surface roughness is augmented, so that the contact resistance increases and becomes unstable. According to the present invention, therefore, the temperature of the contact substrate is controlled within the range of 300° to 900° C. as the contact coating layer is formed on the surface of the contact substrate. Preferably, the temperature of the contact substrate is adjusted to 400° to 800° C., further preferably 300° to 600° C.

According to the present invention, Mo, Zr, Nb, Hf, Ta, and W or alloys of these metals, among other constituents of the contact coating layers 2A, 2B and 2C, all have high melting and boiling points, while additive elements, such as Zn, Cd, Hg, Al, Ga, In, Tl, Ge, Sn, Pb, As, Sb, Bi, etc., have relatively low melting and boiling points.

When a contact coating layer of a certain composition or laminated structure composed of the aforesaid constituents is formed on the surface of the contact substrate, therefore, the aforesaid additive elements having relatively low melting and boiling points may possibly evaporate again, depending on the temperature of the contact substrate. In such a situation, the composition of the contact coating layer varies, so that the coating layer to be manufactured cannot steadily enjoy desired properties.

In manufacturing the contact coating layers 2A, 2B and 2C according to the present invention, therefore, the temperature of the contact substrate is controlled in the following manner.

First, in manufacturing the contact materials A and B, the temperature of the contact substrate is controlled within the range of 300° to 900° C. If the temperature is lower than 300° C., the contact coating layers 2A and 2B may be crystallized unsatisfactorily or become porous pillar-shaped structures, as mentioned before. If the temperature is higher than 900° C., the additive elements are liable to evaporate again, so that the compositions of the contact coating layers 2A and 2B vary, thus hindering the manufacture of encapsulated contact materials with reliable quality. Preferably, the temperature of the contact substrate is controlled within the range of 400° to 800° C., most preferably 300° to 600° C.

The contact coating layers 2A and 2B of the contact materials A and B can be loaded with 1 to 40 atom % of oxygen by forming the layers 2A and 2B in a manner such that the partial pressure of oxygen in the atmosphere of the reaction system is suitably controlled during the aforesaid film formation. Alternatively, the contact coating layers 2A and 2B may be heated in an oxygen-loaded atmosphere, such as the open air, after they are formed.

Even in the latter case, no electrically insulating oxide film can be excessively formed on the surfaces of the contact coating layers 2A and 2B. This is probably because most of oxygen is seized by the additive elements, and the residual oxygen diffuses into the coating layers. It is necessary only that the atmosphere and temperature used for the heat treatment be set suitably. In the open air, for example, the contact coating layers should be heated to a temperature of 100° to 400° C. for 5 to 36 hours. If the temperature is higher than 400° C., oxidation is liable to advance excessively. If the temperature is lower than 100° C., on the other hand, the treatment time is too long for industrial applications.

The aforementioned intermediate and outermost layers can be formed by the conventional film forming method which is applied to the formation of the contact coating layers.

In forming the contact coating layer 2C of the contact material C, the lower layer 2$C_1$ is first formed on the surface of the contact substrate whose temperature is controlled within the range of 300° to 900° C.

If the contact substrate temperature is lower than 300° C., the lower layer 2$C_1$ may be crystallized unsatisfactorily or become a porous pillar-shaped structure, so that its corrosion resistance is lowered, and moreover, its constituents diffuse. If the temperature is higher than 900° C., on the other hand, the lower layer 2$C_1$ becomes a coarse pillar-shaped structure, and its surface roughness is augmented, so that the contact resistance increases and becomes unstable.

In forming the upper layer 2$C_2$ on the lower layer 2$C_1$, thereafter, the temperature of the contact substrate, that is, the temperature of the whole structure including the contact substrate and the lower layer 2$C_1$ thereunder, is controlled within the range of 50° to 500° C. If this temperature is lower than 50° C., the adhesion with the lower layer 2$C_1$ is so poor that the upper layer 2$C_2$ may be separated. If the temperature is higher than 500° C., on the other hand, the formed upper layer 2$C_2$ starts to evaporate again.

The following is a description of a manufacturing method and a method of using the encapsulated contact according to the present invention.

While these methods are applicable to the case where the contact materials A, B and C according to the invention are used as the encapsulated contact materials, they may be effectively applied to contact materials whose contact coating layers are formed of easily oxidizable materials, in particular.

The manufacturing method will be described first.

A given encapsulated contact material is electrically discharged after it is hermetically encapsulated together with an inert gas into a sealed container by a conventional method. Although the method of electrical discharge is not subject to any special restrictions, a voltage of 200 to 3,000 V should preferably be applied across the electrode of the encapsulated contact material for 1 to 100 seconds.

This treatment restrains the increase and variations in the contact resistance during the switching operation, thereby improving the working life performance. Even though the switching operation of the encapsulated contact is performed in a no-load state, the contact resistance cannot easily undergo deterioration.

These effects are believed, though not definitely, to be attributable to the fact that fine particles of the oxide which forms the oxide film on the surface of the contact coating layer are restrained, during the manufacture of the encapsulated contact, from concentrating on actual contact portions of the contact materials as the switching operation advances. Also, the aforesaid effects are supposed to be caused as the fine particles of the oxide are evaporated by intense heat which is generated by the electrical discharge so that the removal of the oxide film of the contact coating layer advances.

The following is a description of the method of using the encapsulated contact according to the present invention.

In this method, the encapsulated contact material is subjected to electrical discharge in the same manner as aforesaid before using the manufactured encapsulated contact.

By doing this, an oxide film, if any, on the contact coating layer of the encapsulated contact material can be prevented from adversely affecting the working life performance, for the same reason as aforesaid.

It is to be understood, moreover, that the working life performance of the encapsulated contact once used can be improved for the same reason as aforesaid by subjecting the contact to the electrical discharge during use.

If the manufacturing method and the method of using are applied to the encapsulated contact, an oxide film, if any, on the contact coating layer of the contact material to be encapsulated can be removed to ensure the encapsulated contact a high working life performance.

Examples 1 to 16 and Comparative Examples 1 to 5

The contact material shown in FIG. 1 was manufactured in the following manner.

First, a 1-mm square plate of a 52% Ni—Fe alloy was prepared as a contact substrate of a blade. The surface of the contact substrate was subjected to 5 minutes of ultrasonic cleaning using acetone and then to electropolishing with phosphoric acid.

Subsequently, the contact substrate was set in a vacuum chamber, and the chamber was evacuated to $2\times10^{-4}$ Pa or less. Then, a valve of a vacuum pump was rendered half-open to reduce the exhaust conductance, and Ar gas was introduced so that the pressure in the chamber was $1\times10^{-1}$ Pa. Thereafter, a voltage of −400 V was applied to the contact substrate so that a high frequency of 0.2 kW was generated from a high-frequency antenna in the chamber, and the surface of the contact substrate was cleaned by an ion bombard process using Ar ions.

The contact substrate 1 was kept at the temperatures shown in Table 1, and the elements shown in Table 1 were evaporated from an electron beam evaporation source which was set in the chamber, whereupon the contact coating layers 2A having the compositions and thicknesses shown in Table 1 were obtained at a deposition speed of 20 angstroms/sec.

Contact materials thus obtained were examined for the following properties.

Contact resistance: A probe of pure Au was brought into contact, under a contact load of 0.1N, with the respective 1-mm square portions of the contact materials immediately after manufacture and the contact materials cooled to room temperature after being left to stand in an $N_2$ atmosphere of 430° C. for 30 minutes, and the then contact resistance (mΩ) was measured by the four point probe method. The measurement was made in the open air at room temperature.

Life performance test: Reed switches using $N_2$ as an encapsulating gas were formed from a pair of contact materials. At room temperature, these switches were operated at 10 Hz by means of a 40 AT (ampere-turn) driving magnetic field in a manner such that they were supplied with a 0.5 A current at 100 V, and the frequency of switching operation repeated before the occurrence of trouble was examined.

The time of the occurrence of trouble is a point of time when the switching operation suffered a failure or when the resistance across the electrode of the reed switch reached 1Ω or more.

Table 1 collectively shows the results of the examination.

TABLE 1

| | | Temperature of Contact Substrate for Film Formation (°C.) | Contact Coating Layer | | | | Contact Resistance(mΩ) | | |
|---|---|---|---|---|---|---|---|---|---|
| | | | | Additive Element | | Thick- | Immediately | | Working |
| | | | Matrix Metal | Symbol | Content (atom %) | ness (μm) | After Manufacture | After Heat Treatment | Life ($10^6$ times) |
| Example No. | 1 | 700 | W | In | 5 | 2 | 12 | 15 | 2.5 |
| | 2 | 700 | W | In | 10 | 2 | 10 | 1.2 | 7.0 |
| | 3 | 700 | W | In | 20 | 2 | 11 | 14 | 6.0 |
| | 4 | 700 | W | In | 50 | 2 | 12 | 15 | 2.5 |
| | 5 | 700 | W | In | 10 | 0.1 | 10 | 12 | 2.0 |
| | 6 | 700 | W | In | 10 | 5 | 10 | 12 | 11.0 |
| | 7 | 700 | W | In | 5 | 2 | 11 | 14 | 3.0 |
| | 6 | 700 | W | In | 10 | 5 | 10 | 12 | 11.0 |
| | 8 | 700 | W | S | 5 | 2 | 12 | 15 | 3.0 |
| | 9 | 600 | Mo | In | 10 | 2 | 13 | 16 | 4.0 |
| | 10 | 600 | Mo | Zn | 5 | 2 | 14 | 17 | 2.5 |
| | 11 | 600 | Mo | Sn | 5 | 2 | 15 | 18 | 2.0 |
| | 12 | 500 | W | Cd | 5 | 2 | 12 | 14 | 3.0 |
| | 13 | 500 | W | Pb | 5 | 2 | 13 | 16 | 3.0 |
| | 14 | 500 | W | Bi | 5 | 2 | 12 | 15 | 2.5 |
| | 15 | 400 | W | Hg | 5 | 2 | 12 | 14 | 2.5 |
| | 16 | 400 | W | Tl | 5 | 2 | 12 | 14 | 2.7 |
| Comparative Example No. | 1 | 700 | W | — | — | 2 | 25 | 35 | 0.2 |
| | 2 | 600 | Mo | — | — | 2 | 35 | 50 | 0.1 |
| | 3 | 700 | W | In | 0.01 | 2 | 20 | 28 | 0.3 |
| | 4 | 700 | W | In | 60 | 2 | 23 | 30 | 0.5 |
| | 5 | 700 | W | In | 10 | 0.01 | 20 | 28 | 0.1 |

Figure 4:
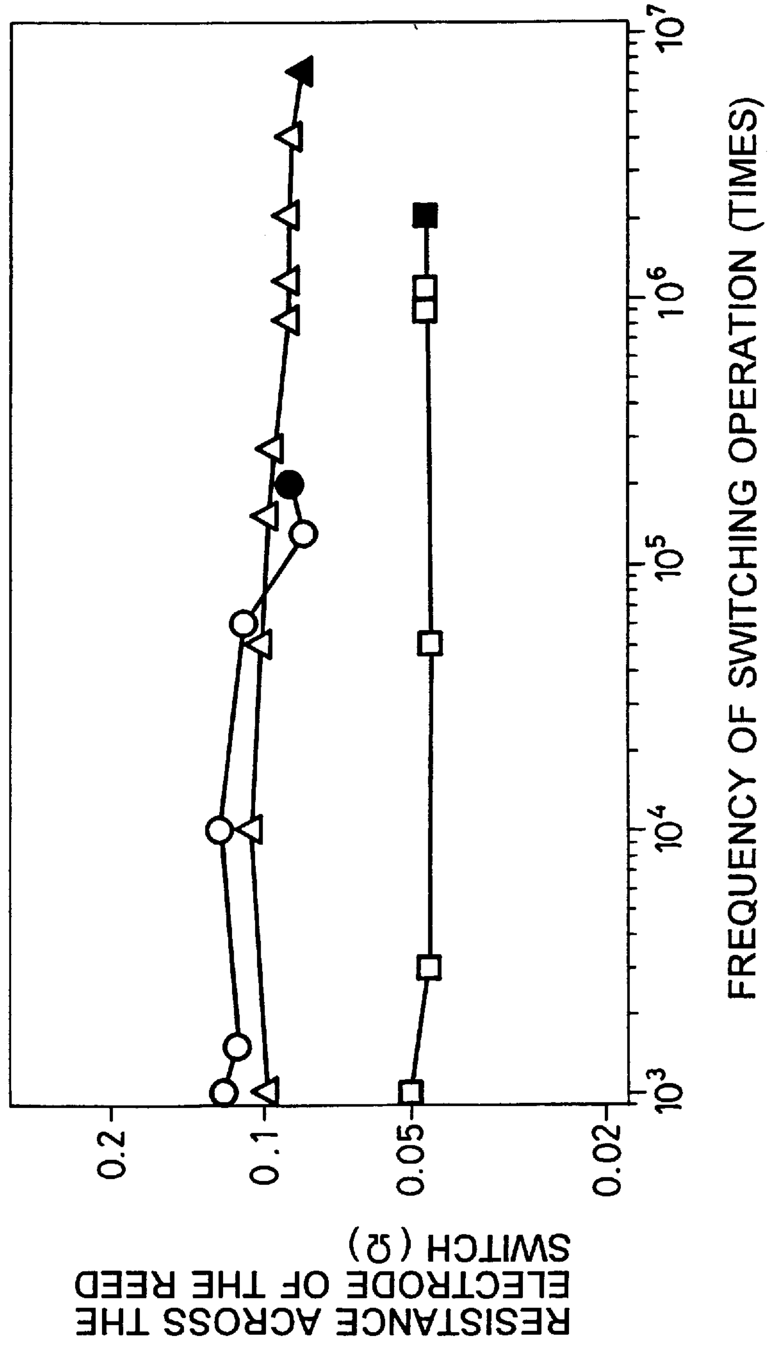
FIG. 4 is a graph showing the relationship between the frequency of switching operation and the resistance across electrodes of reed switches respectively incorporating the contact materials according to Example 2 and Comparative Example 1.

The relations between the frequency of switching operation and the resistance across the electrode of the reed switch were examined for reed switches incorporating the contact materials of Example 2 and Comparative Example 1. FIG. 4 shows the results of this examination. For reference, FIG. 4 illustrates the relations between the frequency of switching operation and the resistance for reed switches incorporating contact materials whose contact coating layers are formed of Rh.

In FIG. 4, white triangles (and black triangle) represent reed switches incorporating the material of Example 2; white circles (and black circle), reed switches incorporating the material of Comparative Example 1; and white squares (and black square), reed switches incorporating a reference material. The black marks indicate the points of time when the switching operation failed.

As seen from the results shown in Table 1, any of the contact materials according to the present invention has a lower contact resistance and enjoys a much better working life performance than the contact materials (Comparative Examples 1 and 2) having the contact coating layers which are not loaded with any additive elements, both immediately after the manufacture and after the heat treatment.

In the case where the content of the additive elements, if any, is lower than 1 atom % or higher than 50 atom % (Comparative Examples 3 and 4), the contact resistance is high and the working life is short. Therefore, the content of the additive elements should be adjusted to 1 to 50 atom %.

If the thickness of the contact coating layer is 0.01 μm, moreover, the working life is extremely short. Therefore, the coating layer thickness should be adjusted to 0.1 μm or more.

As seen from FIG. 4, furthermore, the resistance of the reed switch which incorporates the contact material (Example 2) of the present invention is subject to less variations and steadier than the resistance of the reed switches which incorporate the contact material of Comparative Example 1 and the reference contact material. Thus, the contact material of the invention is good in contact stability. Also, the working life is much longer than that of the reference material (coated with Rh).

Examples 17 to 24 and Comparative Examples 6 and 7

The temperature of each contact substrate was kept at 700° C., the partial pressure of oxygen in the chamber was adjusted, and contact coating layers having the compositions and thicknesses shown in Table 2 were formed on the contact substrate at a deposition speed of 20 angstroms/sec.

The resulting contact materials were measured for the contact resistance and working life performance in the same manner as in the cases of Examples 1 to 16. Table 2 collectively shows the results of the measurement.

TABLE 2

| | | Contact Coating Layer | | | | Contact Resistance(mΩ) | | Working Life |
|---|---|---|---|---|---|---|---|---|
| | | Matrix Metal | Additive Element Symbol | Additive Element Content (atom %) | Thickness (μm) | Immediately After Manufacture | After Heat Treatment | ($10^6$ times) |
| Example No. | 17 | W | In | 10 | 2 | 12 | 15 | 7.5 |
| | | | O | 1.0 | | | | |
| | 18 | W | In | 10 | 2 | 13 | 16 | 6.0 |
| | | | O | 20 | | | | |
| | 19 | W | In | 10 | 2 | 17 | 19 | 8.0 |
| | | | O | 40 | | | | |
| | 20 | W | Sn | 5 | 2 | 15 | 17 | 3.5 |
| | | | O | 1.0 | | | | |
| | 21 | W | Sn | 5 | 2 | 20 | 24 | 3.5 |
| | | | O | 15 | | | | |
| | 22 | W | Cd | 5 | 2 | 14 | 16 | 3.1 |
| | | | O | 5 | | | | |
| | 23 | W | Pb | 5 | 2 | 15 | 17 | 3.1 |
| | | | O | 5 | | | | |
| | 24 | W | Bi | 5 | 2 | 14 | 16 | 3.0 |
| | | | O | 5 | | | | |
| Comparative Example No. | 6 | W | In | 10 | 2 | 12 | 15 | 7.1 |
| | | | O | 0.5 | | | | |
| | 7 | W | In | 10 | 2 | 35 | 44 | 5.5 |
| | | | O | 45 | | | | |

Any of the contact coating layers of Examples 17, 18 and 19 and Comparative Examples 6 and 7 shown in Table 2 was obtained by loading the contact coating layer of Example 2 shown in Table 1 with oxygen. If the contact coating layers are loaded with oxygen, as is evident from comparison between these examples and Example 2, the working life performance is further improved, though the contact resistance somewhat increases. If the oxygen content exceeds 40 atom %, however, the contact resistance increases, and at the same time, the working life performance is lowered (Comparative Example 7). Comparative Example 6 exhibits substantially the same properties as Example 2. This indicates that an oxygen content of less than 1 atom % cannot produce a satisfactory effect.

Examples 25 to 40 and Comparative Examples 8 to 10

Contact coating layers having the compositions and thicknesses shown in Table 3 were formed, and the temperature of the contact substrate was lowered to 300° C. The elements shown in Table 3 were evaporated from the electron beam evaporation source without changing the substrate temperature, and metallic layers having the tabulated thicknesses were formed as outermost layers on the contact coating layers.

The resulting contact materials were measured for the contact resistance and working life performance in the same manner as in the cases of Examples 1 to 16. Table 3 collectively shows the results of the measurement.

TABLE 3

| | | Contact Coating Layer | | | | Outermost Layer (Metallic Layer) | | Contact Resistance (mΩ) | | Working Life |
|---|---|---|---|---|---|---|---|---|---|---|
| | | Matrix Metal | Additive Element Symbol | Additive Element Content (atom %) | Thickness (μm) | Symbol | Thickness (μm) | Immediately After Manufacture | After Heat Treatment | Working Life ($10^6$ times) |
| Example No. | 25 | W | In | 10 | 2 | Ru | 0.05 | 10 | 11 | 7.5 |
| | 26 | W | In | 10 | 2 | Ru | 0.1 | 10 | 10 | 8.0 |
| | 27 | W | In | 10 | 2 | Ru | 1 | 10 | 10 | 8.0 |
| | 28 | W | In | 10 | 2 | Rh | 0.1 | 10 | 10 | 8.0 |
| | 29 | W | In | 10 | 2 | Ir | 0.1 | 10 | 11 | 8.0 |
| | 30 | W | In | 10 | 2 | Os | 0.1 | 10 | 11 | 8.0 |
| | 31 | W | Sn | 5 | 2 | Ru | 0.1 | 10 | 11 | 4.0 |
| | 32 | W | Zn | 5 | 2 | Ru | 0.1 | 11 | 11 | 4.0 |
| | 33 | Mo | In | 10 | 2 | Ru | 0.1 | 12 | 14 | 5.0 |
| | 34 | Mo | In | 10 | 2 | Ir | 0.1 | 14 | 17 | 5.0 |
| | 35 | Mo | In | 10 | 2 | Os | 0.1 | 15 | 18 | 5.0 |
| | 36 | W | Cd | 5 | 2 | Ru | 0.1 | 11 | 13 | 3.2 |
| | 37 | W | Pb | 5 | 2 | Ru | 0.1 | 12 | 15 | 3.1 |
| | 38 | W | Bi | 5 | 2 | Ru | 0.1 | 11 | 13 | 2.8 |
| | 39 | W | Hg | 5 | 2 | Ru | 0.1 | 11 | 12 | 2.7 |
| | 40 | W | Tl | 5 | 2 | Ru | 0.1 | 11 | 14 | 2.8 |

TABLE 3-continued

| | | Contact Coating Layer: Matrix Metal | Additive Element: Symbol | Additive Element: Content (atom %) | Thickness (μm) | Outermost Layer (Metallic Layer): Symbol | Outermost Layer: Thickness (μm) | Contact Resistance (mΩ): Immediately After Manufacture | Contact Resistance (mΩ): After Heat Treatment | Working Life Working ($10^6$ times) |
|---|---|---|---|---|---|---|---|---|---|---|
| Comparative | 8 | W | In | 10 | 2 | Ru | 0.01 | 11 | 12 | 7.0 |
| Example No. | 9 | W | Sn | 5 | 2 | Ru | 0.01 | 11 | 13 | 3.0 |
| | 10 | W | Zn | 5 | 2 | Ru | 0.01 | 11 | 13 | 3.0 |

Any of the contact coating layers of Examples 25 to 30 and Comparative Example 8 shown in Table 3 was obtained by forming an outermost layer on the surface of the contact coating layer of Example 2 shown in Table 1. As is evident from comparison between these examples, the formation of the outermost layer makes the working life longer than that of the contact coating layer of Example 2. If the outermost layer is thin (Comparative Examples 8 to 10), however, improvement of the working life performance cannot be expected. Preferably, therefore, the thickness of the outermost layer should be adjusted to 0.05 μm or more.

Examples 41 to 52 and Comparative Examples 11 and 12

The contact substrates used in Examples 1 to 16 were set in the vacuum chamber, the chamber was charged with an Ar atmosphere of 0.66 Pa, and the temperature of each contact substrate was kept at 400° C. In this state, contact coating layers having the compositions and thicknesses shown in Table 4 were formed by a 0.5 kW DC magnetron sputtering method.

Then, oxygen was introduced into the chamber, and the partial pressure of the oxygen was adjusted. Also, the target was changed, and metallic oxide layers having the tabulated compositions and thicknesses were formed as outermost layers on the contact coating layers.

The resulting contact materials were measured for the contact resistance and working life performance in the same manner as in the cases of Examples 1 to 16. Table 4 collectively shows the results of the measurement.

TABLE 4

| | | Contact Coating Layer: Matrix Metal | Additive Element: Symbol | Additive Element: Content (atom %) | Thickness (μm) | Outermost Layer (Metal Oxide Layer): Symbol | Outermost Layer: Thickness (μm) | Contact Resistance (mΩ): Immediately After Manufacture | Contact Resistance (mΩ): After Heat Treatment | Working Life Working ($10^6$ times) |
|---|---|---|---|---|---|---|---|---|---|---|
| Example No. | 41 | W | In | 10 | 2 | $RuO_2$ | 0.1 | 10 | 11 | 7.5 |
| | 42 | W | In | 10 | 2 | $Rh_2O_3$ | 0.1 | 10 | 11 | 7.5 |
| | 43 | W | Sn | 5 | 2 | $RuO_2$ | 0.1 | 11 | 12 | 4.5 |
| | 44 | W | Zn | 5 | 2 | $RuO_2$ | 0.1 | 11 | 12 | 4.5 |
| | 45 | W | Cd | 5 | 2 | $RuO_2$ | 0.1 | 11 | 13 | 3.4 |
| | 46 | W | Pb | 5 | 2 | $RuO_2$ | 0.1 | 11 | 12 | 3.4 |
| | 47 | W | Bi | 5 | 2 | $RuO_2$ | 0.1 | 12 | 14 | 2.8 |
| | 48 | W | Hg | 5 | 2 | $RuO_2$ | 0.1 | 13 | 15 | 2.7 |
| | 49 | W | Tl | 5 | 2 | $RuO_2$ | 0.1 | 14 | 17 | 2.9 |
| | 50 | Mo | In | 10 | 2 | $RuO_2$ | 0.1 | 12 | 14 | 4.5 |
| | 51 | Mo | Sn | 5 | 2 | $RuO_2$ | 0.1 | 12 | 14 | 3.0 |
| | 52 | Mo | Zn | 5 | 2 | $RuO_2$ | 0.1 | 12 | 14 | 3.0 |
| Comparative | 11 | W | In | 10 | 2 | $RuO_2$ | 0.1 | 10 | 11 | 7.0 |
| Example No. | 12 | W | Sn | 5 | 2 | $RuO_2$ | 0.1 | 11 | 12 | 3.0 |

As seen from comparison between the results shown in Table 4 and Table 1, the working life is long even though the outermost layers, metallic oxide layers, are formed on the surfaces of the contact coating layers. If the cases of Comparative Examples 11 and 12 in which the thickness of the outermost layer is as thin as 0.01 μm, however, the aforementioned effects are not very conspicuous.

Examples 53 to 56 and Comparative Examples 13 and 14

The contact material of Example 2 was heated to the temperatures shown in Table 5 in the open air for 24 hours, whereby its surface was oxidized. The resulting heat-treated products were measured for the contact resistance and working life performance in the same manner as in the cases of Examples 1 to 16. Table 5 collectively shows the results of the measurement.

TABLE 5

| | | Oxidation Conditions | | Contact Resistance (mΩ) | | |
|---|---|---|---|---|---|---|
| | | Temp-era-ture (°C.) | Time (hr) | Immediately After Oxidation | After Heat Treatment | Working Life ($10^6$ times) |
| Example No. | 53 | 100 | 24 | 10 | 12 | 7.5 |
| | 54 | 200 | 24 | 11 | 13 | 7.8 |
| | 55 | 300 | 24 | 12 | 14 | 8.0 |
| | 56 | 400 | 24 | 13 | 15 | 7.8 |
| Comparative | 13 | 70 | 24 | 10 | 12 | 7.0 |
| Example No. | 14 | 500 | 24 | 50 | 60 | 1.0 |

As seen from the results shown in Table 5, the working life performance is improved as in the cases of Examples 41 to 52 even though the contact coating layers are subjected to an oxidative treatment in the open air. The material of Comparative Example 13, whose oxidation temperature is as low as 70° C., is substantially equivalent to the material of Example 2 in properties, and exhibits no effect of the oxidative treatment. In the case of Comparative Example 14 in which the oxidation temperature is so high as 500° C., on the other hand, the contact resistance is too high, and the working life is short. Preferably, therefore, the temperature for the oxidative treatment is adjusted to 100° to 400° C.

Examples 57 to 76 and Comparative Examples 15 to 19

The contact materials A shown in FIG. 1 were manufactured in the same conditions as in Examples 1 to 16 except that the temperature of the contact substrate was adjusted in the manner shown in Table 6.

Twenty contact materials were measured for the contact resistance and working life performance in the same manner as in the cases of Examples 1 to 16. Table 6 collectively shows the results of the measurement. Average values and standard deviations are given for the working life performance.

TABLE 6

| | | Temperature of Contact Substrate for Film Formation (°C.) | Contact Coating Layer | | | | Contact Resistance (mΩ) | Working Life | |
|---|---|---|---|---|---|---|---|---|---|
| | | | Matrix Metal | Additive Element: Symbol | Additive Element: Content (atom %) | Thickness (μm) | | Average Value ($10^6$ times) | Standard Deviation ($10^6$ times) |
| Example No. | 57 | 300 | W | In | 10 | 2 | 9 | 10.0 | 2.2 |
| | 58 | 400 | W | In | 10 | 2 | 9 | 11.0 | 2.4 |
| | 59 | 600 | W | In | 10 | 2 | 10 | 10.0 | 2.3 |
| | 60 | 700 | W | In | 10 | 2 | 10 | 7.0 | 7.0 |
| | 61 | 300 | W | Zn | 5 | 2 | 9 | 5.0 | 1.1 |
| | 62 | 500 | W | Zn | 5 | 2 | 8 | 6.0 | 1.3 |
| | 63 | 600 | W | Zn | 5 | 2 | 9 | 5.5 | 1.2 |
| | 64 | 700 | W | Zn | 5 | 2 | 11 | 3.0 | 3.1 |
| | 65 | 300 | W | Zn | 5 | 2 | 9 | 5.5 | 1.2 |
| | 66 | 400 | W | Zn | 5 | 2 | 8 | 6.5 | 1.4 |
| | 67 | 600 | W | Zn | 5 | 2 | 9 | 5.0 | 1.0 |
| | 68 | 700 | W | Zn | 5 | 2 | 12 | 3.0 | 2.9 |
| | 69 | 300 | Mo | In | 10 | 2 | 10 | 3.0 | 0.6 |
| | 70 | 500 | Mo | In | 10 | 2 | 12 | 3.5 | 0.7 |
| | 71 | 600 | Mo | In | 10 | 2 | 13 | 4.0 | 0.8 |
| | 72 | 700 | Mo | In | 10 | 2 | 14 | 2.0 | 2.1 |
| | 73 | 300 | Mo | Zn | 5 | 2 | 14 | 2.5 | 0.5 |
| | 74 | 500 | Mo | Zn | 5 | 2 | 13 | 3.5 | 0.6 |
| | 75 | 600 | Mo | Zn | 5 | 2 | 14 | 2.5 | 0.5 |
| | 76 | 700 | Mo | Zn | 5 | 2 | 16 | 2.0 | 2.1 |
| Comparative Example No. | 15 | 200 | W | In | 10 | 2 | 20 | 0.6 | 0.5 |
| | 16 | 200 | W | nn | 5 | 2 | 21 | 0.4 | 0.3 |
| | 17 | 200 | W | Sn | 5 | 2 | 20 | 0.3 | 0.2 |
| | 18 | 200 | Mo | In | 10 | 2 | 20 | 0.4 | 0.3 |
| | 19 | 200 | Mo | Zn | 5 | 2 | 20 | 0.3 | 0.2 |

As seen from Table 6, the average switching frequency in the working life of the material of each Comparative Example, in which the layer was formed with the contact substrate temperature kept at 200° C., is lower than that of the material of each Example. Moreover, the materials of these Comparative Examples cannot be regarded as highly reliable, since their standard deviations are so great that their life characteristics are subject to variations. When the contact coating layers of these materials were microscopically observed after manufacture, many of them were found to be separated substantially, and the surface of the contact substrate was fully covered by few coating layers.

In the materials of those Examples in which the contact substrate temperature was kept at 700° C., on the other hand, the surface of the contact substrate was found to be covered more securely by the contact coating layers than in the materials with the contact substrate temperature kept at 200° C. However, their working life characteristics are poorer than those of the material of those Examples in which the contact substrate temperature was kept at 300° to 600° C. This may be attributable to the fact that the additive elements evaporate again due to the high contact substrate temperature during the film formation, thereby causing variations of the content of the additive elements in the matrix metal.

Accordingly, it is advisable to control the temperature of the contact substrate during the film formation within the range of 300° to 600° C.

Examples 77 to 96 and Comparative Examples 20 to 24

The chamber was charged with an ($Ar+O_2$) atmosphere of 0.66 Pa with the contact substrates kept at the temperatures shown in Table 7, and contact coating layers having the compositions and thicknesses shown in Table 7 were formed by the 0.5 kW DC magnetron sputtering method.

The resulting contact materials were measured for the contact resistance and working life characteristics, including the average switching frequency and standard deviation, in the same manner as in the cases of Examples 57 to 76. Table 7 collectively shows the results of the measurement.

TABLE 7

| | | Temperature of Contact Substrate for Film Formation (°C.) | Contact Coating Layer | | | | | Contact Resistance (mΩ) | Working Life | |
|---|---|---|---|---|---|---|---|---|---|---|
| | | | Matrix Metal | Additive Element Symbol | Additive Element Content (atom %) | Oxygen Content (atom %) | Thickness (μm) | | Average Value ($10^6$ times) | Standard Deviation ($10^6$ times) |
| Example No. | 77 | 300 | W | In | 10 | 2 | 2 | 12 | 12.0 | 2.2 |
| | 78 | 400 | W | In | 10 | 2 | 2 | 12 | 13.0 | 2.7 |
| | 79 | 600 | W | In | 10 | 2 | 2 | 13 | 12.0 | 2.5 |
| | 80 | 700 | W | In | 10 | 2 | 2 | 13 | 6.0 | 6.1 |
| | 81 | 300 | W | Zn | 5 | 2 | 2 | 17 | 6.0 | 1.3 |
| | 82 | 500 | W | Zn | 5 | 2 | 2 | 13 | 6.5 | 1.4 |
| | 83 | 600 | W | Zn | 5 | 2 | 2 | 16 | 6.0 | 1.4 |
| | 84 | 700 | W | Zn | 5 | 2 | 2 | 19 | 3.1 | 3.0 |
| | 85 | 300 | W | Sn | 5 | 2 | 2 | 18 | 6.0 | 1.4 |
| | 86 | 400 | W | Sn | 5 | 2 | 2 | 15 | 7.0 | 1.5 |
| | 87 | 600 | W | Sn | 5 | 2 | 2 | 17 | 6.0 | 1.4 |
| | 88 | 700 | W | Sn | 5 | 2 | 2 | 20 | 3.4 | 3.1 |
| | 89 | 300 | Mo | In | 10 | 2 | 2 | 14 | 4.0 | 0.9 |
| | 90 | 500 | Mo | In | 10 | 2 | 2 | 15 | 4.5 | 0.9 |
| | 91 | 600 | Mo | In | 10 | 2 | 2 | 17 | 4.5 | 0.9 |
| | 92 | 700 | Mo | In | 10 | 2 | 2 | 20 | 2.5 | 2.3 |
| | 93 | 300 | Mo | Zn | 5 | 2 | 2 | 19 | 3.0 | 0.5 |
| | 94 | 500 | Mo | Zn | 5 | 2 | 2 | 17 | 4.0 | 0.6 |
| | 95 | 600 | Mo | Zn | 5 | 2 | 2 | 19 | 3.0 | 0.7 |
| | 96 | 700 | Mo | Zn | 5 | 2 | 2 | 23 | 2.3 | 2.4 |
| Comparative Example No. | 20 | 200 | W | In | 10 | 2 | 2 | 20 | 0.6 | 0.5 |
| | 21 | 200 | W | Zn | 5 | 2 | 2 | 20 | 0.4 | 0.3 |
| | 22 | 200 | W | Sn | 5 | 2 | 2 | 21 | 0.3 | 0.2 |
| | 23 | 200 | Mo | In | 10 | 2 | 2 | 20 | 0.4 | 0.3 |
| | 24 | 200 | Mo | Zn | 5 | 2 | 2 | 21 | 0.4 | 0.3 |

As seen from Table 7, the working life characteristics can be made better than in the cases of the materials of Examples 57 to 76 by loading the contact coating layers with oxygen. Even in this case, however, the working life characteristics are worsened if the temperature of the contact substrate during the film formation is lowered to 200° C. It is advisable, therefore, to control the contact substrate temperature during the film formation within the range of 300° to 600° C.

Examples 97 to 109 and Comparative Examples 25 to 30

The matrix metals and additive elements shown in Table 8 were set in each of two electron beam evaporation sources in the vacuum chamber which was used to manufacture Examples 1 to 16, and each contact substrate was kept at the temperature of 400° C. Contact coating layers having the tabulated thicknesses were formed in this state.

Each matrix metal was evaporated so that its concentration is 100 atom % on the contact substrate side with respect to the thickness direction of each contact coating layer. Thereafter, the evaporation was gradually reduced so that the matrix metal concentration was 0 atom % on the surface of the contact coating layer. Thus, a concentration gradient was formed in the thickness direction of the contact coating layer. In this process, the deposition speed for the matrix metal was fixed at 20 angstroms/sec.

On the other hand, each additive element was distributed with a concentration gradient such that its concentration was 0 atom % on the contact substrate side, and was gradually increased so that it was 100 atom % on the surface of the contact coating layer. Also in this case, the deposition speed was fixed at 20 angstroms/sec.

Thus, each resulting contact coating layer has a composition such that the additive element is contained in the matrix metal. However, the additive element has a concentration gradient in the thickness direction of the layer. More specifically, the additive element is distributed more densely on the contact substrate side than on the surface side.

This basic operation was repeated to form laminated structures of the contact coating layers. Table 8 shows the number of the laminated structures.

The resulting contact materials were measured for the contact resistance and working life characteristics in the same manner as in the cases of Examples 57 to 76. Table 8 collectively shows the results of the measurement.

TABLE 8

| | | Temperature of Contact Substrate for Film Formation (°C.) | Contact Coating Layer | | | | Contact Resistance (mΩ) | Working Life | |
|---|---|---|---|---|---|---|---|---|---|
| | | | Matrix Metal | Additive Element | Thickness (μm) | Number of Laminated Structure | | Average Value ($10^6$ times) | Standard Deviation ($10^6$ times) |
| Example No. | 97 | 400 | W | In | 0.2 | 1 | 9 | 12.0 | 2.5 |
| | 98 | 400 | W | In | 0.1 | 2 | 10 | 13.4 | 2.5 |
| | 99 | 400 | W | In | 2.0 | 1 | 9 | 14.0 | 2.6 |
| | 100 | 400 | W | Zn | 0.2 | 1 | 8 | 8.0 | 1.6 |
| | 101 | 400 | W | Zn | 2.0 | 1 | 8 | 9.4 | 1.7 |
| | 102 | 400 | W | Sn | 0.2 | 1 | 9 | 7.0 | 1.4 |
| | 103 | 400 | W | Sn | 2.0 | 1 | 9 | 8.5 | 1.5 |
| | 104 | 400 | Mo | In | 0.2 | 1 | 10 | 5.5 | 1.1 |
| | 105 | 400 | Mo | In | 2.0 | 1 | 10 | 6.7 | 1.2 |
| | 106 | 400 | Mo | Zn | 0.2 | 1 | 13 | 4.1 | 0.8 |
| | 107 | 400 | Mo | Zn | 2.0 | 1 | 13 | 5.8 | 1.1 |
| | 108 | 400 | Mo | Sn | 0.2 | 1 | 15 | 4.0 | 0.8 |
| | 109 | 400 | Mo | Sn | 2.0 | 1 | 15 | 5.0 | 0.9 |
| Comparative Example No. | 25 | 400 | W | In | 0.05 | 1 | 13 | 2.0 | 2.1 |
| | 26 | 400 | W | Zn | 0.05 | 1 | 12 | 3.0 | 3.1 |
| | 27 | 400 | W | Sn | 0.05 | 1 | 12 | 2.0 | 2.2 |
| | 28 | 400 | Mo | In | 0.05 | 1 | 14 | 3.0 | 3.0 |
| | 29 | 400 | Mo | Zn | 0.05 | 1 | 16 | 2.0 | 1.9 |
| | 30 | 400 | Mo | Sn | 0.05 | 1 | 18 | 2.0 | 2.2 |

Despite the concentration gradient of the additive element in each contact coating layer, as seen from Table 8, the average switching frequency is high, and the standard deviation is small, thus ensuring satisfactory working life characteristics. In the cases of Comparative Examples 25 to 30 in which the contact coating layers are relatively thin, however, the working life characteristics are poorer. Thus, it is advisable to adjust the layer thickness to 0.1 μm or more.

Examples 110 to 120 and Comparative Examples 31 and 32

Contact coating layers with concentration gradients for the matrix metal and additive element were formed in the same manner as in Examples 97 to 109 except that the temperature of the contact substrate was varied in the manner shown in Table 9.

The resulting contact materials were measured for the contact resistance and working life characteristics in the same manner as in the cases of Examples 97 to 109. Table 9 collectively shows the results of the measurement.

TABLE 9

| | | Temperature of Contact Substrate for Film Formation (°C.) | Contact Coating Layer | | | | Working Life | |
|---|---|---|---|---|---|---|---|---|
| | | | Matrix Metal | Additive Element | Thickness (μm) | Contact Resistance (mΩ) | Average Value ($10^6$ times) | Standard Deviation ($10^6$ times) |
| Example No. | 110 | 300 | W | In | 2 | 9 | 12.0 | 2.4 |
| | 111 | 500 | W | In | 2 | 9 | 13.0 | 2.6 |
| | 112 | 600 | W | In | 2 | 10 | 12.0 | 2.4 |
| | 113 | 700 | W | In | 2 | 11 | 6.5 | 6.5 |
| | 114 | 300 | W | Zn | 2 | 8 | 6.0 | 1.1 |
| | 115 | 500 | W | Zn | 2 | 8 | 7.0 | 1.5 |
| | 116 | 600 | W | Zn | 2 | 8 | 6.0 | 1.2 |
| | 117 | 700 | W | Zn | 2 | 13 | 3.0 | 3.2 |
| | 118 | 400 | W | Sn | 2 | 8 | 7.0 | 1.5 |
| | 119 | 400 | Mo | In | 2 | 10 | 4.5 | 0.9 |
| | 120 | 400 | Mo | Zn | 2 | 12 | 4.0 | 0.8 |
| Comparative Example No. | 31 | 200 | W | Zn | 2 | 20 | 0.5 | 0.4 |
| | 32 | 200 | W | Zn | 2 | 20 | 0.4 | 0.3 |

When the temperature of the contact substrate is at 200° C., as seen from Table 9, the contact resistance increases, while the working life characteristics worsen. If the temperature of the contact substrate reaches 700° C., the working life characteristics tend to worsen. Thus, it is advisable to control the contact substrate temperature within the range of 300° to 600° C.

Examples 121 to 133 and
Comparative Examples 33 to 35

The contact materials B shown in FIG. 2 were manufactured in the following manner.

The contact substrates used in Examples 1 to 16 were set in the vacuum chamber, the chamber was charged with an $(Ar+O_2)$ atmosphere of 0.66 Pa, and the temperature of each contact substrate was kept at 400° C. In this state, contact coating layers having the compositions and thicknesses shown in Table 10 were formed by a 0.7 kW RF magnetron sputtering method.

The resulting contact materials were measured for the contact resistance and working life performance in the same manner as in the cases of Examples 1 to 16. Table 10 collectively shows the results of the measurement.

TABLE 10

| | | Contact Coating Layer | | | | Contact Resistance(mΩ) | | |
|---|---|---|---|---|---|---|---|---|
| | | | Metal Oxide | | Thick- | Immediately | | Working |
| | | Matrix Metal | Symbol | Content (mole %) | ness (μm) | After Manufacture | After Heat Treatment | Life ($10^6$ times) |
| Example No. | 121 | W | $In_2O_3$ | 1 | 2 | 12 | 15 | 4.0 |
| | 122 | W | $In_2O_3$ | 5 | 2 | 14 | 18 | 5.0 |
| | 123 | W | $In_2O_3$ | 50 | 2 | 16 | 20 | 4.5 |
| | 124 | W | $In_2O_3$ | 5 | 0.1 | 14 | 18 | 2.0 |
| | 125 | W | $In_2O_3$ | 5 | 5 | 14 | 18 | 1.0 |
| | 126 | W | $SnO_2$ | 3 | 2 | 8 | 20 | 3.0 |
| | 127 | W | ZnO | 3 | 2 | 20 | 22 | 4.0 |
| | 128 | W | CdO | 3 | 2 | 14 | 16 | 3.0 |
| | 129 | W | PbO | 3 | 2 | 15 | 17 | 3.0 |
| | 130 | W | $Bi_2O_3$ | 3 | 2 | 16 | 18 | 3.5 |
| | 131 | Mo | $In_2O_3$ | 5 | 2 | 18 | 21 | 4.5 |
| | 132 | Mo | $SnO_2$ | 3 | 2 | 22 | 24 | 4.2 |
| | 133 | Mo | ZnO | 3 | 2 | 25 | 27 | 4.1 |
| Comparative | 33 | W | $In_2O_3$ | 0.1 | 2 | 20 | 22 | 0.5 |
| Example No. | 34 | W | $In_2O_3$ | 60 | 2 | 40 | 50 | 1.3 |
| | 35 | W | $In_2O_3$ | 5 | 0.01 | 12 | 15 | 0.2 |

As seen from Table 10, the working life performance of each contact coating layer is much better than in the cases of Comparative Examples 1 to 5 shown in Table 1 even in the case where an oxide of the additive element is contained in a matrix metal. If the oxide content is too low or too high, as in the cases of Comparative Examples 33 and 34, the contact resistance increases, and the working life performance worsens inevitably. Preferably, therefore, the oxide content in the matrix metal should be adjusted to 1 to 50 mole %.

Both immediately after the manufacture and after the heat treatment, the contact resistance of the contact material of each Example is lower than that of the contact material of each Comparative Example.

Examples 134 to 145 and
Comparative Examples 36 to 37

Contact coating layers having the compositions and thicknesses shown in Table 11 were formed on the surfaces of the contact substrates in the same manner in the cases of Examples 121 to 133. Then, the target was changed, and metallic layers having the thicknesses shown in Table 11 were formed as outermost layers on the contact coating layers by the 0.5 kW DC magnetron sputtering method.

The resulting contact materials were measured for the contact resistance and working life performance in the same manner as in the cases of Examples 121 to 133. Table 11 collectively shows the results of the measurement.

TABLE 11

| | | Contact Coating Layer | | | | Outermost Layer (Metallic Layer) | | Contact Resistance (mΩ) | | |
|---|---|---|---|---|---|---|---|---|---|---|
| | | | Oxide | | Thick- | | Thick- | Immedia-tely After | After Heat | Working Life |
| | | Matrix Metal | Symbol | Content (mole %) | ness (μm) | Symbol | ness (μm) | Manufac-ture | Treat-ment | ($10^6$ times) |
| Example No. | 134 | W | $In_2O_3$ | 5 | 2 | Ru | 0.1 | 12 | 15 | 6.0 |
| | 135 | W | $SnO_2$ | 3 | 2 | Ru | 0.1 | 14 | 18 | 3.8 |

TABLE 11-continued

| | | Contact Coating Layer | | | | Outermost Layer (Metallic Layer) | | Contact Resistance (mΩ) | | |
|---|---|---|---|---|---|---|---|---|---|---|
| | | | Oxide | | | | | | | |
| | | Matrix Metal | Symbol | Content (mole %) | Thickness (μm) | Symbol | Thickness (μm) | Immediately After Manufacture | After Heat Treatment | Working Life ($10^6$ times) |
| | 136 | W | ZnO | 3 | 2 | Ru | 0.1 | 16 | 20 | 4.5 |
| | 137 | W | $In_2O_3$ | 5 | 2 | Rh | 0.1 | 12 | 15 | 5.8 |
| | 138 | W | $In_2O_3$ | 5 | 2 | Ir | 0.1 | 12 | 15 | 5.3 |
| | 139 | W | $In_2O_3$ | 5 | 2 | Os | 0.1 | 11 | 14 | 5.5 |
| | 140 | W | CdO | 3 | 2 | Ru | 0.1 | 14 | 17 | 3.7 |
| | 141 | W | PbO | 3 | 2 | Ru | 0.1 | 15 | 17 | 3.5 |
| | 142 | W | $Bi_2O_3$ | 3 | 2 | Ru | 0.1 | 15 | 17 | 4.0 |
| | 143 | Mo | $In_2O_3$ | 5 | 2 | Ru | 0.1 | 18 | 21 | 4.8 |
| | 144 | Mo | $SnO_2$ | 3 | 2 | Ru | 0.1 | 22 | 24 | 4.6 |
| | 145 | Mo | ZnO | 3 | 2 | Ru | 0.1 | 25 | 27 | 4.4 |
| Comparative | 6 | W | $In_2O_3$ | 5 | 2 | Ru | 0.01 | 14 | 18 | 5.0 |
| Example No. | 7 | W | $SnO_2$ | 3 | 2 | Ru | 0.01 | 18 | 20 | 3.0 |

Examples 146 to 155 and Comparative Examples 38 to 39

Contact coating layers having the compositions and thicknesses shown in Table 12 were formed on the surfaces of the contact substrates in the same manner in the cases of Examples 121 to 133. Then, the target was changed, and metallic oxide layers having the compositions and thicknesses shown in Table 12 were formed as outermost layers on the contact coating layers by the 0.5 kW DC magnetron sputtering method.

The resulting contact materials were measured for the contact resistance and working life performance in the same manner as in the cases of Examples 121 to 133. Table 12 collectively shows the results of the measurement.

TABLE 12

| | | Contact Coating Layer | | | | Outermost Layer (Metallic Oxide Layer) | | Contact Resistance (mΩ) | | |
|---|---|---|---|---|---|---|---|---|---|---|
| | | | Oxide | | | | | | | |
| | | Matrix Metal | Symbol | Content (mole %) | Thickness (μm) | Symbol | Thickness (μm) | Immediately After Manufacture | After Heat Treatment | Working Life ($10^6$ times) |
| Example No. | 146 | W | 5 | 2 | $RuO_2$ | 0.1 | 13 | 16 | 5.5 | |
| | 147 | W | 5 | 2 | $Rh_2O_3$ | 0.1 | 13 | 16 | 5.3 | |
| | 148 | W | 3 | 2 | $RuO_2$ | 0.1 | 14 | 16 | 3.4 | |
| | 149 | W | 3 | 2 | $RuO_2$ | 0.1 | 15 | 17 | 3.4 | |
| | 150 | W | 3 | 2 | $RuO_2$ | 0.1 | 16 | 18 | 3.8 | |
| | 151 | W | 3 | 2 | $RuO_2$ | 0.1 | 15 | 19 | 4.8 | |
| | 152 | W | S | 2 | $RuO_2$ | 0.1 | 17 | 22 | 4.8 | |
| | 153 | Mo | 5 | 2 | $RuO_2$ | 0.1 | 19 | 22 | 4.8 | |
| | 154 | Mo | 3 | 2 | $RuO_2$ | 0.1 | 24 | 28 | 4.7 | |
| | 155 | Mo | 3 | 2 | $RuO_2$ | 0.01 | 27 | 29 | 4.5 | |
| Comparative | 38 | W | 5 | 2 | $RuO_2$ | 0.01 | 14 | 18 | 5.0 | |
| Example No. | 39 | W | 3 | 2 | $RuO_2$ | 0.01 | 18 | 20 | 3.0 | |

Even though the metallic layers or metallic oxide layers are formed as the outermost layers on the surface of the contact coating layers, as seen from Tables 11 and 12, the working life is longer than in the cases of Examples 121 to 133 which involve no such treatment. However, this effect cannot be produced satisfactorily if the outermost layers are thin.

Examples 156 to 170 and Comparative Examples 40 to 47

The contact materials C shown in FIG. 3 were manufactured in the following manner.

Contact substrates were set in the vacuum chamber used in Examples 1 to 16, and were kept at the temperature (600° C.) shown in Table 13. In this state, lower layers 2$C_1$ of the tabulated metals from the electron beam evaporation source, having the tabulated thicknesses, were formed at the deposition speed of 20 angstroms/sec. Then, the contact substrate temperature was set at 200° C., and in this state, upper layers 2$C_2$ of the tabulated elements having the tabulated thicknesses were formed individually on the lower layers 2$C_1$ at the deposition speed of 20 angstroms/sec. Thus, contact coating layers 2C were formed having a laminated structure.

The resulting contact materials were measured for the contact resistance and working life characteristics in the same manner as in the cases of Examples 1 to 16. Table 13 collectively shows the results of the measurement.

TABLE 13

| | | Contact Coating Layer: Lower Layer: Temperature of Contact Substrate for Film Formation (°C.) | Lower Layer: Constituent Element | Lower Layer: Thickness (μm) | Upper Layer: Temperature of Contact Substrate for Film Formation (°C.) | Upper Layer: Constituent Element | Upper Layer: Thickness (μm) | Number of Laminated Structure | Contact Resistance (mΩ) | Working Life: Average Value ($10^6$ times | Working Life: Standard Deviation ($10^6$ times) |
|---|---|---|---|---|---|---|---|---|---|---|---|
| Example No. | 156 | 600 | W | 0.1 | 200 | In | 0.1 | 1 | 10 | 15.0 | 3.0 |
| | 157 | 600 | W | 0.1 | 200 | In | 0.1 | 2 | 9 | 13.0 | 3.0 |
| | 158 | 600 | W | 0.1 | 200 | In | 0.1 | 5 | 9 | 14.0 | 3.1 |
| | 159 | 600 | W | 0.8 | 200 | In | 0.1 | 1 | 9 | 14.0 | 3.4 |
| | 160 | 600 | W | 0.8 | 200 | In | 0.4 | 1 | 10 | 15.0 | 3.0 |
| | 161 | 600 | W | 0.1 | 200 | Zn | 0.1 | 1 | 8 | 7.0 | 1.4 |
| | 162 | 600 | W | 0.1 | 200 | Zn | 0.1 | 5 | 8 | 8.0 | 1.4 |
| | 163 | 600 | W | 0.8 | 200 | Zn | 0.2 | 1 | 9 | 7.0 | 1.3 |
| | 164 | 600 | W | 0.1 | 200 | Sn | 0.1 | 1 | 8 | 7.0 | 1.4 |
| | 165 | 600 | W | 0.8 | 200 | Sn | 0.2 | 1 | 8 | 7.0 | 1.5 |
| | 166 | 600 | Mo | 0.1 | 200 | In | 0.1 | 1 | 10 | 5.5 | 1.2 |
| | 167 | 600 | Mo | 0.1 | 200 | In | 0.1 | 3 | 10 | 4.5 | 1.0 |
| | 168 | 600 | Mo | 0.8 | 200 | In | 0.2 | 1 | 10 | 5.5 | 1.2 |
| | 169 | 600 | Mo | 0.1 | 200 | Zn | 0.1 | 2 | 13 | 4.0 | 0.9 |
| | 170 | 600 | Mo | 0.8 | 200 | Zn | 0.2 | 1 | 12 | 4.0 | 0.7 |
| Comparative Example No. | 40 | 600 | W | 0.8 | 200 | In | 0.05 | 1 | 13 | 6.0 | 5.9 |
| | 41 | 600 | W | 0.05 | 200 | In | 0.8 | 1 | 12 | 7.0 | 6.8 |
| | 42 | 600 | W | 0.1 | 200 | In | 0.05 | 4 | 13 | 6.0 | 6.0 |
| | 43 | 600 | W | 0.05 | 200 | In | 0.1 | 3 | 12 | 6.0 | 5.9 |
| | 44 | 600 | W | 0.8 | 200 | Zn | 0.05 | 1 | 11 | 3.0 | 3.1 |
| | 45 | 600 | W | 0.8 | 200 | Sn | 0.05 | 1 | 12 | 3.0 | 3.0 |
| | 46 | 600 | Mo | 0.8 | 200 | In | 0.05 | 1 | 14 | 2.0 | 2.1 |
| | 47 | 600 | Mo | 0.8 | 200 | Zn | 0.05 | 1 | 16 | 2.0 | 2.1 |

If the aforesaid laminated structure is formed, as seen from Table 13, the average switching frequency is higher than in the cases of the contact materials of Examples 1 to 16 shown in Table 1. If either of the lower and upper layers 2$C_1$ and 2$C_2$ are thinner than 0.1 μm, the average switching frequency is lowered, and the standard deviation is increased, as seen from comparison between the materials of the Examples and Comparative Examples shown in FIG. 13. Thus, the lower and upper layers should be adjusted to a thickness of 0.1 μm or more.

Examples 171 to 181 and Comparative Examples 48 to 51

Contact substrates were set in the vacuum chamber used in Examples 1 to 16, and were kept at the temperatures shown in Table 14. In this state, lower layers 2$C_1$ having the tabulated thicknesses were formed at the deposition speed of 20 angstroms/sec. by evaporating the tabulated metals from the electron beam evaporation source. Then, the contact substrate temperatures were lowered to the tabulated values, and the tabulated elements were evaporated at these temperatures. Thus, upper layers 2$C_2$ having the tabulated thicknesses were formed into laminated structures at the deposition speed of 20 angstroms/sec.

The resulting contact materials were measured for the contact resistance and working life characteristics in the same manner as in the cases of Examples 1 to 16. Table 14 collectively shows the results of the measurement.

TABLE 14

| | | Contact Coating Layer | | | | | | | | |
|---|---|---|---|---|---|---|---|---|---|---|
| | | Lower Layer | | | Upper Layer | | | | | |
| | | Temperature of Contact Substrate for Film Formation (°C.) | Constituent Element | Thickness ($\mu$m) | Temperature of Contact Substrate for Film Formation (°C.) | Constituent Element | Thickness ($\mu$m) | Contact Resistance (m$\Omega$) | Working Life: Average Value ($10^6$ times | Working Life: Standard Deviation ($10^6$ times) |
| Example No. | 171 | 400 | W | 0.8 | 100 | In | 0.2 | 9 | 15.0 | 3.0 |
| | 172 | 800 | W | 0.8 | 100 | In | 0.2 | 10 | 15.6 | 3.1 |
| | 173 | 600 | W | 0.8 | 50 | In | 0.2 | 9 | 14.5 | 3.0 |
| | 174 | 600 | W | 0.8 | 500 | In | 0.2 | 9 | 15.0 | 3.0 |
| | 175 | 600 | W | 0.8 | 50 | Zn | 0.2 | 9 | 7.0 | 1.4 |
| | 176 | 600 | W | 0.8 | 500 | Zn | 0.2 | 9 | 8.0 | 1.5 |
| | 177 | 600 | W | 0.8 | 200 | Sn | 0.2 | 9 | 7.0 | 1.4 |
| | 178 | 600 | Mo | 0.8 | 100 | In | 0.2 | 13 | 5.5 | 1.2 |
| | 179 | 600 | Mo | 0.8 | 200 | In | 0.2 | 13 | 6.0 | 1.2 |
| | 180 | 500 | Mo | 0.8 | 200 | Zn | 0.2 | 12 | 6.0 | 1.1 |
| | 181 | 600 | Mo | 0.8 | 200 | Sn | 0.2 | 14 | 4.5 | 0.9 |
| Comparative Example No. | 48 | 200 | W | 0.8 | 200 | In | 0.2 | 15 | 6.0 | 6.1 |
| | 49 | 900 | W | 0.8 | 200 | In | 0.2 | 14 | 7.0 | 7.2 |
| | 50 | 600 | W | 0.8 | 30 | In | 0.2 | 15 | 6.0 | 6.1 |
| | 51 | 600 | W | 0.8 | 550 | In | 0.2 | 15 | 6.5 | 6.0 |

As seen from Table 14, the contact resistance and working life characteristics of the contact materials vary considerably, depending on the relationship between the temperatures of the contact substrates for the formation of the upper and lower layers.

As regards the contact substrate temperature for the formation of the lower layers, for example, comparison between Example 171 and Comparative Example 48 indicates that the contact resistance is higher and the working life characteristics are worse when the temperature is at 200° C. than when it is at 400° C. The same applies to the relation between the cases of temperatures of 900° C. (Comparative Example 49) and 800° C. (Example 172). Thus, it is advisable to control the contact substrate temperature for the formation of the lower layers within the range of 400° to 800° C.

As regards the contact substrate temperature for the formation of the upper layers, on the other hand, comparison between Example 173 and Comparative Example 50 indicates that the contact resistance is higher and the working life characteristics are worse when the temperature is at 30° C. than when it is at 50° C. The same applies to the relation between the cases of temperatures of 550° C. (Comparative Example 51) and 500° C. (Example 174). Thus, it is advisable to control the contact substrate temperature for the formation of the upper layers within the range of 50° to 500° C.

Examples 182 to 189 and Comparative Examples 52 to 57

Contact substrates were set in the vacuum chamber in the same manner as in Examples 1 to 16, and were kept at the tabulated temperature (400° C.).

Then, the same basic operation for Examples 97 to 109 was carried out to form lower layers having the compositions, thicknesses, and numbers of laminated structures shown in Table 15. Thereafter, the contact substrate temperature was lowered to and kept at 200° C., whereupon upper layers of the tabulated elements having the tabulated thicknesses were formed individually on the lower layers. The deposition speed for the formation of the upper layers was adjusted to 25 angstroms/sec.

Accordingly, each contact coating layer thus obtained has a laminated structure, including a lower layer having an concentration gradient for an additive element and the upper layer composed of the additive element.

The resulting contact materials were measured for the contact resistance and working life characteristics in the same manner as in the cases of Examples 1 to 16. Table 15 collectively shows the results of the measurement.

TABLE 15

| | | Contact Coating Layer | | | | | | | | | | |
|---|---|---|---|---|---|---|---|---|---|---|---|---|
| | | Lower Layer | | | | | Upper Layer | | | | Working Life | |
| | | Temperature of Contact Substrate for Film Formation (°C.) | Constitute Element | Additive Element | Number of Laminated Structure | Thickness (μm) | Temperature of Contact Substrate for Film Formation (°C.) | Additive Element | Thickness (μm) | Contact Resistance (mΩ) | Average Value ($10^6$ times) | Standard Deviation $10^6$ times) |
| Example No. | 182 | 400 | W | In | 2 | 1 | 200 | In | 0.1 | 9 | 16.0 | 3.1 |
| | 183 | 400 | W | In | 2 | 2 | 200 | In | 0.1 | 9 | 18.0 | 3.6 |
| | 184 | 400 | W | Zn | 2 | 1 | 200 | Zn | 0.1 | 8 | 9.0 | 1.8 |
| | 185 | 400 | W | Sn | 2 | 1 | 200 | Sn | 0.1 | 9 | 9.5 | 1.9 |
| | 186 | 400 | Mo | In | 2 | 1 | 200 | In | 0.1 | 13 | 4.6 | 0.9 |
| | 187 | 400 | Mo | In | 2 | 1 | 200 | Ln | 0.1 | 9 | 7.0 | 1.5 |
| | 188 | 400 | W | Zn | 2 | 1 | 200 | Zn | 0.1 | 12 | 7.0 | 1.6 |
| | 189 | 400 | W | Sn | 2 | 1 | 200 | Sn | 0.1 | 14 | 6.5 | 1.5 |
| Comparative Example No. | 52 | 400 | W | In | 2 | 1 | 200 | In | 0.05 | 9 | 14.0 | 14.0 |
| | 53 | 400 | W | nn | 2 | 1 | 200 | Zn | 0.05 | 8 | 8.5 | 8.2 |
| | 54 | 400 | W | Sn | 2 | 1 | 200 | Sn | 0.05 | 9 | 8.5 | 8.3 |
| | 55 | 400 | Mo | In | 2 | 1 | 200 | In | 0.05 | 10 | 6.6 | 6.0 |
| | 56 | 400 | Mo | Zn | 2 | 1 | 200 | Zn | 0.05 | 13 | 5.9 | 5.8 |
| | 57 | 400 | Mo | Sn | 2 | 1 | 200 | Sn | 0.05 | 15 | 5.0 | 4.9 |

As seen from Table 15, the contact materials constructed in this manner also have good working life characteristics. Comparison between the materials of the Examples and Comparative Examples indicates that the average switching frequency is lowered and the standard deviation is increased, that is, the working life characteristics are worsened, if the upper layer thickness is reduced. Thus, upper layer thickness should be adjusted to 0.1 μm or more.

Examples 190 to 199 and Comparative Examples 58 to 59

Contact coating layers were formed in the same manner as in the cases of Examples 182 to 189 except that the temperatures of the contact substrates for the formation of the lower and upper layers were varied in the manner shown in Table 16.

The resulting contact materials were measured for the contact resistance and working life characteristics in the same manner as in the cases of Examples 182 to 189. Table 16 collectively shows the results of the measurement.

TABLE 16

| | | Contact Coating Layer | | | | | | | | | |
|---|---|---|---|---|---|---|---|---|---|---|---|
| | | Lower Layer | | | | Upper Layer | | | | Working Life | |
| | | Temperature of Contact Substrate for Film Formation (°C.) | Constituent Element | Additive Element | Thickness (μm) | Temperature of Contact Substrate for Film Formation (°C.) | Constituent Element | Thickness (μm) | Contact Resistance (mΩ) | Average Value ($10^6$ times) | Standard Deviation $10^6$ times) |
| Example No. | 190 | 300 | W | In | 2 | 200 | In | 0.2 | 9 | 16.0 | 3.0 |
| | 191 | 600 | W | In | 2 | 200 | In | 0.2 | 8 | 17.0 | 3.4 |
| | 192 | 400 | W | In | 2 | 50 | In | 0.2 | 9 | 16.5 | 3.2 |
| | 193 | 400 | W | In | 2 | 500 | In | 0.2 | 9 | 16.5 | 3.2 |
| | 194 | 400 | W | Zn | 2 | 200 | Zn | 0.2 | 12 | 9.0 | 1.7 |
| | 195 | 400 | W | Sn | 2 | 200 | Sn | 0.2 | 14 | 9.5 | 1.7 |
| | 196 | 700 | W | In | 2 | 200 | In | 0.2 | 8 | 4.5 | 4.6 |
| Comparative Example No | 58 | 200 | W | In | 2 | 200 | In | 0.2 | 20 | 0.5 | 0.4 |
| | 59 | 400 | W | In | 2 | 30 | In | 0.2 | 20 | 0.7 | 0.6 |
| | 60 | 400 | W | In | 2 | 550 | Tn | 0.2 | 10 | 10.2 | 9.0 |

Also in this case, as seen from Table 16, the contact resistance can be lowered, the average switching frequency can be increased, and the standard deviation can be reduced, by controlling the contact substrate temperature within the range of 300° to 600° C. in forming the upper layers and within the range of 50° to 500° C. in forming the lower layers, as in the cases of Examples 171 to 181.

Examples 197 to 220 and Comparative Examples 60 to 67

Various contact materials (reed pins) were manufactured by the method described in connection with Examples 1 to 16.

When the respective surfaces of the contact coating layers of the obtained contact materials were microscopically observed, oxide particles with diameters of several micrometers were recognized.

Then, the contact materials, along with an $N_2$ gas, were hermetically encapsulated into sealed containers to form encapsulated contacts (reed switches).

The encapsulated contacts thus obtained were subjected to electrical discharge processing in the conditions shown in Tables 17 and 18. The Comparative Examples shown in Tables 17 and 18 are cases in which the contacts were not subjected to electrical discharge processing.

Subsequently, the encapsulated contacts were examined for working life characteristics as follows.

Low-load life performance test: A voltage of 5 V was applied to the encapsulated contacts, and the contacts were repeatedly operated at 100 Hz by means of a 40 AT driving magnetic field in a manner such that they were supplied with a 100 μA current, and the frequency of switching operation repeated before the occurrence of trouble was measured.

High-load life performance test: At room temperature, the other encapsulated contacts than Examples 206, 207, 208 and 211 were repeatedly operated at 10 Hz by means of a 40 AT driving magnetic field in a manner such that they were supplied with a 100 μA current at 0.5 A, and the frequency of switching operation repeated before the occurrence of trouble was measured.

In either of these life performance tests, the time of the occurrence of trouble is a point of time when the switching operation suffered a failure or when the resistance across the electrode of the encapsulated contact reached 1Ω or more.

Tables 17 and 18 collectively show the results of the measurement.

TABLE 17

| | | Temperature of Contact Substrate for Film Formation (°C.) | Contact Coating Layer | | | | Discharge Conditions | | | Results of Low-Load Life Performance Test (Working Life; $10^5$ times) | Results of High-Load Life Performance Test (Working Life; $10^5$ times) |
|---|---|---|---|---|---|---|---|---|---|---|---|
| | | | Matrix Metal | Additive Element Symbol | Additive Element Content (atom %) | Thickness (μm) | Voltage (V) | Current (mA) | Discharge Time (second) | | |
| Example No. | 197 | 700 | W | — | — | 2 | 200 | 100 | 2 | 1500 | 0.5 |
| | 198 | 700 | W | — | — | 2 | 1000 | 1 | 10 | 1500 | 0.4 |
| | 199 | 700 | W | — | — | 2 | 1000 | 100 | 0.1 | 1400 | 0.5 |
| | 200 | 700 | W | In | 10 | 2 | 3000 | 10 | 2 | 1400 | 21 |
| | 201 | 700 | W | In | 10 | 2 | 1000 | 10 | 2 | 1500 | 20 |
| | 202 | 700 | W | In | 10 | 2 | 200 | 10 | 20 | 1600 | 22 |
| | 203 | 700 | W | In | 10 | 2 | 1000 | 100 | 2 | 1400 | 20 |
| | 204 | 700 | W | In | 10 | 2 | 1000 | 10 | 2 | 1500 | 21 |
| | 205 | 700 | W | In | 10 | 2 | 1000 | 1 | 2 | 1600 | 22 |
| | 206 | 700 | W | In | 10 | 2 | 1000 | 10 | 0.1 | 1600 | — |
| | 207 | 700 | W | In | 10 | 2 | 1000 | 10 | 10 | 1500 | — |
| | 208 | 700 | W | In | 10 | 2 | 1000 | 10 | 100 | 1400 | — |
| | 209 | 700 | W | Sn | 5 | 2 | 1000 | 100 | 2 | 1500 | 14 |
| | 210 | 700 | W | Sn | 5 | 2 | 3000 | 1 | 10 | 1400 | 15 |
| | 211 | 700 | W | Sn | 5 | 2 | 1000 | 100 | 0.1 | 1400 | — |
| | 212 | 700 | W | Zn | 5 | 2 | 3000 | 100 | 2 | 1400 | 16 |

TABLE 18

| | | Temperature of Contact Substrate for Film Formation (°C.) | Contact Coating Layer | | | | Discharge Conditions | | | Results of Low-Load Life Performance Test (Working Life; $10^5$ times) | Results of High-Load Life Performance Test (Working Life; $10^5$ times) |
|---|---|---|---|---|---|---|---|---|---|---|---|
| | | | Matrix Metal | Additive Element Symbol | Additive Element Content (atom %) | Thickness (μm) | Voltage (V) | Current (mA) | Discharge Time (second) | | |
| Example No. | 213 | 700 | W | Zn | 5 | 2 | 3000 | 1 | 10 | 1400 | 15 |
| | 214 | 700 | W | Zn | 5 | 2 | 3000 | 100 | 0.1 | 1500 | 14 |
| | 215 | 600 | Mo | — | — | 2 | 1000 | 50 | 5 | 1200 | 0.4 |
| | 216 | 600 | Mo | — | — | 2 | 500 | 50 | 10 | 1200 | 0.5 |
| | 217 | 600 | Mo | In | 10 | 2 | 1000 | 50 | 5 | 1300 | 15 |
| | 218 | 600 | Mo | In | 10 | 2 | 500 | 50 | 10 | 1200 | 14 |
| | 219 | 600 | Mo | Sn | 5 | 2 | 1000 | 50 | 5 | 1200 | 11 |
| | 220 | 600 | Mo | Zn | 5 | 2 | 1000 | 50 | 5 | 1100 | 10 |
| Comparative Example No. | 60 | 700 | W | — | — | 2 | — | — | — | 0.5 | 0.5 |
| | 61 | 700 | W | In | 10 | 2 | — | — | — | 0.4 | 20 |
| | 62 | 700 | W | Sn | 5 | 2 | — | — | — | 0.5 | 15 |
| | 63 | 700 | W | Zn | 5 | 2 | — | — | — | 0.6 | 15 |
| | 64 | 600 | Mo | — | — | 2 | — | — | — | 0.5 | 0.4 |

TABLE 18-continued

| | Temperature of Contact Substrate for Film Formation (°C.) | Contact Coating Layer | | | | Discharge Conditions | | | Results of Low-Load Life Performance Test (Working Life; $10^5$ times) | Results of High-Load Life Performance Test (Working Life; $10^5$ times) |
|---|---|---|---|---|---|---|---|---|---|---|
| | | Matrix Metal | Additive Element Symbol | Additive Element Content (atom %) | Thickness ($\mu$m) | Voltage (V) | Current (mA) | Discharge Time (second) | | |
| 65 | 600 | Mo | In | 10 | 2 | — | — | — | 0.5 | 15 |
| 66 | 600 | Mo | Sn | 5 | 2 | — | — | — | 0.4 | 10 |
| 67 | 600 | Mo | Zn | 5 | 2 | — | — | — | 0.5 | 10 |

Figure 5:
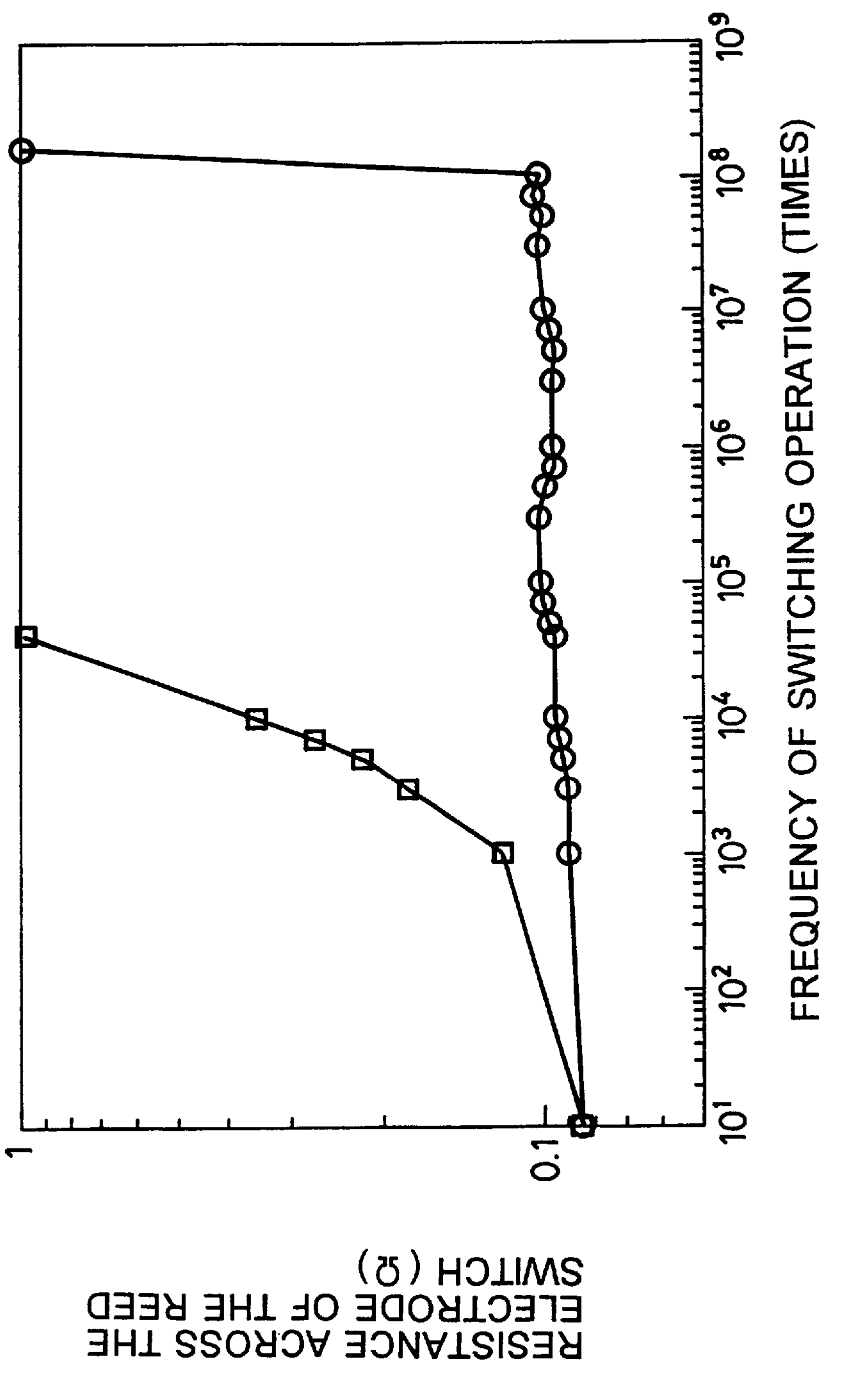
FIG. 5 is a graph showing the relationship between the frequency of switching operation and the resistance across electrodes of reed switches according to Example 202 and Comparative Example 61, respectively.

The reed switches of Example 202 and Comparative Example 61 were subjected to the same operation as in the aforesaid low-load life performance test, and the resistance across the electrode of each switch was measured. FIG. 5 shows the results of the measurement in terms of the relationship between the switching frequency and resistance.

In FIG. 5, white circles represent the case of the reed switch of Example 202, and white squares the case of the reed switch of Comparative Example 61.

As seen from the results shown in Tables 17 and 18, the encapsulated contacts of the Examples subjected to electrical discharge processing have much better life characteristics than the encapsulated contacts of the Comparative Examples. Stabilized working life performance under high load requires the stabilization of the low-load working life performance at the least. In the low-load life performance test, as seen from FIG. 5, the resistance across the contact of each Example, as compared with the switching frequency, is steadier than that of each Comparative Example. Thus, the switching operation of each encapsulated contact can be stabilized by subjecting the contact to electrical discharge processing before actual use, as in the case of each Example.

Figure 6:
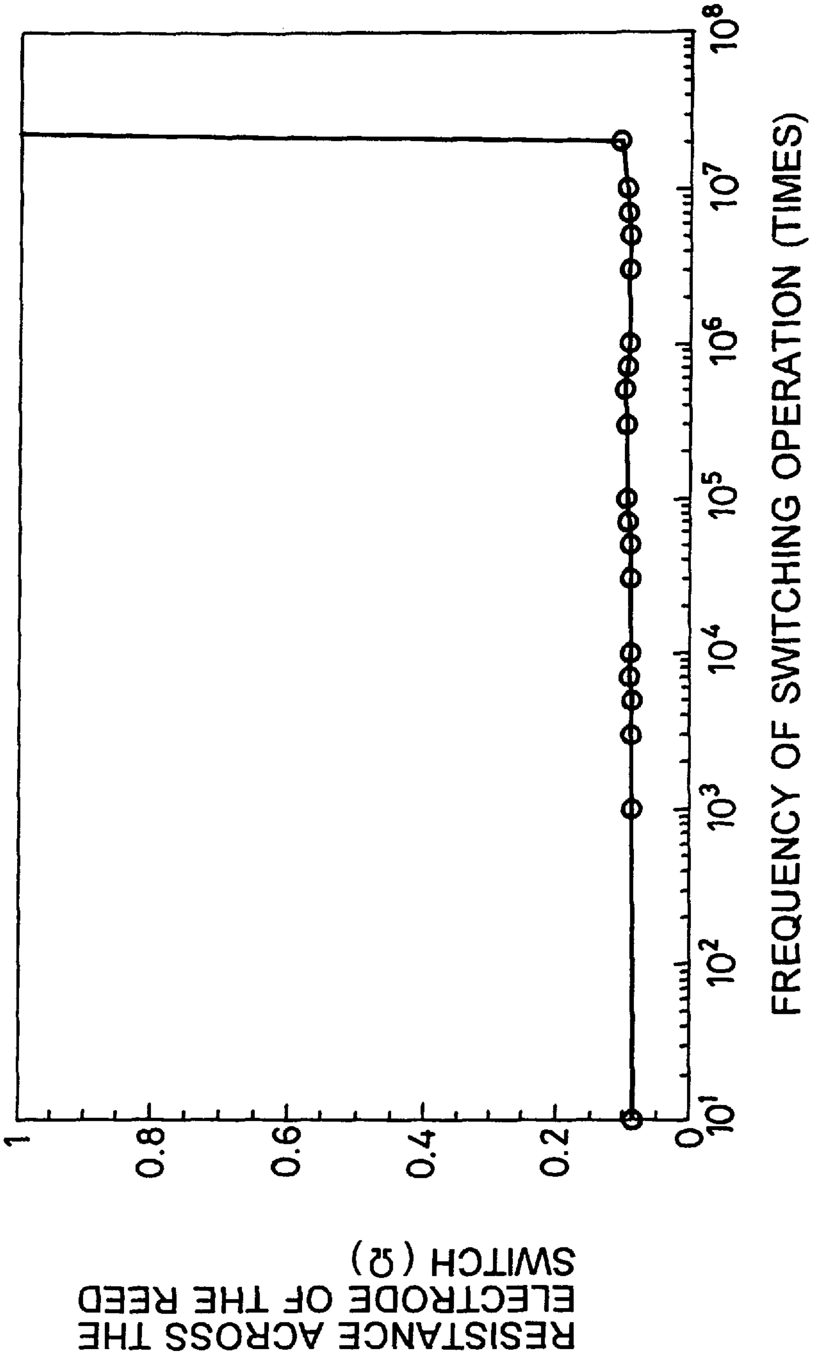
FIG. 6 is a graph showing the relationship between the frequency of switching operation and the resistance across electrodes, observed when a reed switch according to Example 202 is subjected to high-load life performance test.

The encapsulated contact of Example 202 was subjected to the same operation as in the aforesaid high-load life performance test, and the resistance across the contact was measured. FIG. 6 shows the relationship between the switching frequency and resistance. As seen from FIG. 6, the encapsulated contact of Example 202 enjoys a working life level of twenty million times in terms of the switching frequency. Thus, each encapsulated contact manufactured by the method according to the present invention is designed so that the resistance across it is stable in both the low- and high-load life performance tests.

Although the encapsulated contacts of the Examples described above are ones which have been subjected to electrical discharge processing, it is to be understood that undischarged encapsulated contacts can produce the same effects as aforesaid only if they are subjected to electrical discharge processing before use. Even after their use is started, moreover, the encapsulated contacts can produce the same results if they undergo electrical discharge processing during use.

What is claimed is:

1. An encapsulated contact material comprising:

a contact substrate and at least one contact coating layer covering the surface of the contact substrate, the contact coating layer including a matrix formed of at least one first element selected from the group consisting of Mo, Zr, Nb, Hf, Ta and W, the matrix being loaded with 0.5 to 50 atom % of at least one second element or 0.1 to 50 mole % of at least one oxide of said second element, said second element selected from the group consisting of Zn, Cd, Hg, Al, Ga, In, Tl, Ge, Sn, Pb, As, Sb and Bi, and the contact coating layer having a thickness of 0.1 $\mu$m or more.

2. The encapsulated contact material according to claim 1, wherein the matrix is loaded with 0.5 to 50 atom % of said at least one second element.

3. The encapsulated contact material according to claim 1, wherein the matrix is loaded with 0.1 to 50 mole % of the oxide of said at least one second element.

4. An encapsulated contact material comprising:

a contact substrate and at least one contact coating layer covering the surface of the contact substrate, the contact coating layer having a laminated structure including at least one lower layer formed of at least one element selected from a group including Mo, Zr, Nb, Hf, Ta, and W and at least one upper layer disposed on the at least one lower layer, the at least one upper layer being formed of at least one element selected from a group including Zn, Cd, Hg, Al, Ga, In, Tl, Ge, Sn, Pb, As, Sb, and Bi, and the at least one lower layer having a thickness of 0.1 $\mu$m or more and the at least one upper layer having a thickness of 0.1 $\mu$m or more.

5. The encapsulated contact material according to claim 2, wherein said contact coating layer has a concentration gradient such that said at least one element selected from the group consisting of Zn, Cd, Hg, Al, Ga, In, Tl, Ge, Sn, Pb, As, Sb, and Bi exists more densely on the surface.

6. The encapsulated contact material according to claim 2 wherein said contact coating layer is loaded with 1 to 40 atom % of oxygen.

7. The encapsulated contact material according to claim 2, wherein the surface of said contact coating layer is coated with an outermost layer formed of a metal or metallic oxide and having a thickness of 0.05 $\mu$m or more.

8. A method for manufacturing an encapsulated contact material, comprising forming a contact coating layer on the surface of a contact substrate at a temperature of 300° to 900° C., the contact coating layer including a matrix formed of at least one first element selected from the group consisting of Mo, Zr, Nb, Hf, Ta and W, the matrix being loaded with 0.5 to 50 atom % of at least one second element or 0.1 to 50 mole % of at least one oxide of said second element, said second element selected from the group consisting of Zn, Cd, Hg, Al, Ga, In, Tl, Ge, Sn, Pb, As, Sb and Bi, and the contact coating layer having a thickness of 0.1 $\mu$m or more.

9. The method according to claim 8, wherein the temperature of said contact substrate is controlled within the range of 300° to 600° C.

10. A method for manufacturing contact material, comprising:

forming a contact coating layer on the surface of a contact substrate, the contact coating layer having a laminated structure including at least one lower layer formed of at least one element selected from a group including Mo, Zr, Nb, Hf, Ta, and W and at least one upper layer disposed on the at least one lower layer, the at least one upper layer being formed of at least one element selected from a group including Zn, Cd, Hg, Al, Ga, In, Tl, Ge, Sn, Pb, As, Sb, and Bi, and the at least one lower layer having a thickness of 0.1 μm or more and at least upper layer having a thickness of 0.1 μm or more, wherein during the forming of the at least one lower layer the temperature is 300° to 600° C. and during the forming of the at least one upper layer the temperature is 50° to 500° C.

11. The method according to claim 10, wherein the temperature is 400° to 800° C. during the forming of the at least one lower layer.

12. A method for manufacturing an encapsulated contact, comprising:

encapsulating an encapsulated contact material together with an inert gas in a sealed container; and electrically discharging the encapsulated contact material.

13. A method of preventing an oxide film from adversely affecting the performance of a contact, comprising:

encapsulating the contact material according to claim 3 together with an inert gas in a sealed container and electrically discharging the encapsulated contact material during operation of the encapsulated contact material.

14. The encapsulated contact material according to claim 3, wherein said contact coating layer is loaded with 1 to 40 atom % of oxygen.

15. The encapsulated contact material according to claim 3, wherein the surface of said contact coating layer is coated with an outermost layer formed of a metal or metallic oxide and having a thickness of 0.05 μm or more.

16. The encapsulated contact material according to claim 4, wherein the surface of said contact coating layer is coated with an outermost layer formed of a metal or metallic oxide and having a thickness of 0.05 μm or more.

17. The encapsulated contact material according to claim 4, wherein the contact substrate is made of a material selected from the group consisting of Fe, Ni, Co, Ni—Fe, Co—Fe—Nb, Co—Fe—V, Fe—Ni—Ni—Al—Ti, Fe—Co—Ni, carbon steel, phosphor bronze, nickel silver, brass, stainless steel, Cu—Ni—Sn and Cu—Ti and wherein the at least one lower layer is formed of a metal or alloy selected from the group consisting of Mo, Zr, Nb, Hf, Ta, W, Hf—Nb, Hf—Ta, Hf—Mo, Hf—Zr, Hf—W, Mo—Nb, Mo—Ta, Mo—Zr, M—W, Nb—Ta, Nb—W, Nb—Zr, Ta—W, Ta—Zr and W—Zr.

18. The encapsulated contact material according to claim 1, wherein the first element is W and the second element is In.

19. The encapsulated contact material according to claim 15, wherein the metal or metallic oxide is selected from the group consisting of Ru, Rh, Re, Pd, Os, Ir, Pt, Ag, Au, Ag—Au, Ag—Pd, Ag—Pt, Ag—Rh, Au—Pd, Au—Pt, Au—Rh, Ir—Os, Ir—Pt, Ir—Ru, Os—Pd, Os—Ru, Pd—Pt, Pd—Rh, Rd—Ru, Pt—Rh, Re—Rh, Re—Ru, $RuO_2$, $Rh_2O_3$, $RhO_2$, $ReO_3$, $OSO_4$, $IrO_2$ and $Ir_2O_3$.

20. The encapsulated contact material according to claim 16, wherein the metal or metallic oxide is selected from the group consisting of Ru, Rh, Re, Pd, Os, Ir, Pt, Ag, Au, Ag—Au, Ag—Pd, Ag—Pt, Ag—Rh, Au—Pd, Au—Pt, Au—Rh, Ir—Os, Ir—Pt, Ir—Ru, Os—Pd, Os—Ru, Pd—Pt, Pd—Rh, Rd—Ru, Pt—Rh, Re—Rh, Re—Ru, $RuO_2$, $Rh_2O_3$, $RhO_2$, $ReO_3$, $OSO_4$, $IrO_2$ and $Ir_2O_3$.

* * * * *